United States Patent [19]

Takahashi et al.

[11] Patent Number: 5,712,496
[45] Date of Patent: Jan. 27, 1998

[54] MOS POLY-SI THIN FILM TRANSISTOR WITH A FLATTENED CHANNEL INTERFACE AND METHOD OF PRODUCING SAME

[75] Inventors: Hiroshi Takahashi; Yoshikazu Kojima, both of Tokyo, Japan

[73] Assignee: Seiko Instruments, Inc., Chiba, Japan

[21] Appl. No.: 2,400

[22] Filed: Jan. 13, 1993

[30] Foreign Application Priority Data

Jan. 17, 1992 [JP] Japan ................... 4-027288

[51] Int. Cl.$^6$ ........................... H01L 29/08
[52] U.S. Cl. ............... 257/64; 257/66; 257/67; 257/69; 437/233
[58] Field of Search ............ 437/233; 257/64, 257/69, 67, 66, 347

[56] References Cited

U.S. PATENT DOCUMENTS

| | | | |
|---|---|---|---|
| 3,304,469 | 2/1967 | Weimer | 257/66 |
| 4,511,800 | 4/1985 | Harbeke et al. | 250/372 |
| 4,597,160 | 7/1986 | Ipri | 29/571 |
| 4,915,772 | 4/1990 | Fehlner et al. | 156/620.7 |
| 5,051,380 | 9/1991 | Maeda et al. | 437/238 |
| 5,064,779 | 11/1991 | Hasegawa | 437/109 |

FOREIGN PATENT DOCUMENTS 63-207181  8/1988  Japan.

OTHER PUBLICATIONS

S.M. Sze, Physics of Semiconductor Devices, Second Ed., pp. 492–493, 509 (John Wiley & Sons 1981).
Shyh Wang, Fundamentals of Semiconductor Theory and Device Physics, p. 452 (Prentice Hall 1989).

Primary Examiner—Jerome Jackson, Jr.
Assistant Examiner—John Guay
Attorney, Agent, or Firm—Loeb & Loeb LLP

[57] ABSTRACT

A thin film field effect transistor has a three-layer structure including a polycrystalline semiconductor layer to be a channel region, a conductive layer to be a gate electrode and a insulating layer to be a gate insulating film between the channel region and the gate electrode. The roughness of an interface between the channel region and the gate insulating film is less than a few nm so that the current drivability of the transistor is improved.

6 Claims, 23 Drawing Sheets

5,712,496

MOS POLY-SI THIN FILM TRANSISTOR WITH A FLATTENED CHANNEL INTERFACE AND METHOD OF PRODUCING SAME

BACKGROUND OF THE INVENTION

This invention relates to a thin film field effect transistor (hereinafter referred to as a ("TFT") using polycrystalline semiconductor film and a method of producing a TFT. In further detail, this invention relates to the channel region surface structure of a TFT.

TFT devices are among the main components of semiconductor integrated circuit devices. Especially, since TFTs are suitable for comparably large area devices because of a wide choice of TFT substrates, the range of applications of TFTs has increased.

FIG. 18 shows one example of an active matrix type liquid crystal display panel using a TFT. This panel is composed of liquid crystal pixels 101 arranged in a matrix. Each of the pixels 101 is provided with a respective TFT 102 serving as a driver. The gate electrode of each TFT 102 is connected to a scan line 103, the source electrode is connected to a data line 104, and the drain electrode is connected to a pixel electrode 106. A plurality of scan lines are scanned sequentially to select the TFTs which are connected to each scan line, and a picture signal on each data line 104 connected to a TFT whose scan line is being scanned is written into the corresponding liquid crystal pixel 101.

FIG. 19 shows a sectional view of part of an active matrix type liquid crystal display panel. The TFT 102 and the pixel electrode 106 are formed on a glass substrate 105, and a common electrode 108 is formed on an internal surface of an opposed substrate 107. A liquid crystal material 109 is sandwiched between the two substrates, and the pixels are defined between the pixel electrode 106 and the common electrode 108. The TFT 102 has a three-layer structure composed of a semiconductor layer 110, an insulating layer 111 and a conductive layer 112. Semiconductor layer 110 is patterned to form a channel region ch, a source region S, and a drain region D. The semiconductor layer 110 is a thin film composed of, for instance, amorphous silicon (a-Si) or polycrystalline silicon (poly-Si), so that this MIS transistor device is called a TFT. The insulating layer 111 constituted a gate insulating film OX and is composed of an oxide film and so on. Further, the conductive layer 112 is patterned with an electrode and constitutes a gate electrode G.

In the liquid crystal display panel mentioned above, it is desirable to reduce the size of each pixel to improve display resolution and operation frequency. Therefore, it is necessary to scale down the device geometry of the TFT itself and to improve the electrical characteristics of the TFT. Especially, the current drivability of a Poly-Si TFT is about two orders to magnitude than that of an a-Si TFT so that a small active panel with TFT integrated driver circuits can be realized. Driver circuits are integrated with Poly-Si TFTs.

FIG. 20 shows another application of TFTs. This is a Static Random Access Memory (hereinafter referred to as an "SRAM"). Recent increases in memory capacity have stimulated development of a 4M SRAM. As the degree of integration advances, reduction in standby power becomes an important goal. As a result, memory cells having a CMOS structure become necessary. A metal oxide semiconductor (hereinafter referred to as "MOS") transistor is one kind of the MIS transistor, especially which uses an oxide film as a gate insulating film. CMOS means a complementary type MOS, and is composed of a P-type MOS transistor (PMOS) and an N-type MOS transistor (NMOS). As shown in FIG. 20, the 4M SRAM is composed of a memory cell 201 having a CMOS structure as its base. The memory cell 201 is composed of a pair of inverters 202 and 203, and each inverter is composed of a CMOS. The memory cell 201 is coupled to bit lines 206 through a pair of switching transistors 204 and 205, respectively. Switching transistors 204 and 205 are connected to a word line 207. The word line 207 selects memory cell 201, and binary data is written into and read out from the memory cell through the bit line 206.

FIG. 21 shows the structure of inverter 202. In the inverter 202, respective gate electrodes of the PMOS and the NMOS are connected, and the PMOS and the NMOS are connected in series.

FIG. 22 illustrates the structure of a typical CMOS. The NMOS is formed on a surface of a P-type semiconductor substrate 208 composed of monocrystalline silicon. The NMOS is composed of N+ type source and drain regions which are formed in the surface of the substrate 208, a gate oxide film OX, and a gate electrode G. A channel region ch is provided between the source region and the drain region. On the other hand, the PMOS is formed in an N well 209 formed in substrate 208. The PMOS is composed of P+ type source and drain regions, a gate oxide film OX, and a gate electrode G. A channel region ch is formed between the source region and the drain region.

As mentioned above, conventionally the NMOS and the PMOS are adjacently formed in the same plane. However, the extent to which high circuit integration can be achieved is limited by the fact that they are formed in the same plane. Therefore, a conventional TFT can be formed as a multilayer CMOS, as shown in FIG. 23, where a PMOS is formed on a semiconductor substrate 208 of monocrystalline silicon like the conventional CMOS, while an NMOS is fabricated, as a TFT, on the PMOS. In this way, the utilization factor of the substrate can be approximately doubled. The NMOS is composed of a conductive layer 210, an insulating layer 211 and a semiconductor layer 212. The conductive layer 210 patterned as an electrode constituted a gate electrode G, which is used by both the NMOS and the PMOS in common. The insulating layer 211 is formed of silicon dioxide and so on and constituted a gate insulating film OX.

Further, the semiconductor layer 212 constitutes a channel region ch2. On both sides of the channel region are formed a source region S and a drain region D of N+ type. The channel region of the PMOS is represented as ch1. The semiconductor layer 212 is composed of, for example, a polycrystalline silicon thin film or amorphous silicon thin film. It would be desirable to further miniaturize and increase the operating speed of TFTs used in the SRAMs like the TFTs used in active matrix type liquid crystal display panels mentioned above.

As mentioned above, the conventional TFT is a key element of an active-matrix LCD panel and a high density SRAM and furthermore of a general integrated circuit.

As mentioned above, in the TFT, generally polycrystalline silicon films or amorphous silicon films are used. However, amorphous and polycrystalline films are inferior in performance as a semiconductor material to monocrystalline silicon. As a straightforward example, the carrier mobility of polycrystalline silicon is smaller by order of magnitude or more than that of monocrystalline silicon, or approximately 500 cm/Vsec. Further, amorphous silicon is smaller in carrier mobility than polycrystalline silicon by one or two orders of magnitude. The above difference in carrier mobility results from the difference in size of crystal grains included in materials and in the trap density at grain boundaries. In other words, the larger the size becomes, that is, the more the size approaches a monocrystal, the higher the carrier mobility becomes, and therefore, a TFT having excellent characteristics can be obtained. On the other hand, as to forming a film, an amorphous silicon thin film can be formed at relatively low temperature, 590° C. or less. Polycrystalline silicon films require relatively high temperature, 600° C. or more, to be formed.

Consequently, the polycrystalline silicon TFT is superior to the amorphous silicon TFT as a thin film transistor having high driving performance, that its channel carrier mobility is close to that of the crystal silicon transistor. However, the carrier mobility of polycrystalline silicon TFTs is smaller than that of monocrystalline silicon transistors. Then, two methods for increasing mobility have been conventionally developed: to increase the crystal grain size and to inactivate defects in a grain boundary. These two methods are disclosed in the following treatise:

-I-Wei Wu et al. "Passivation Kinetics of Two Type of Defects in Polysilicon TFT by Plasma Hydrogenation," IEEE Electron Device Lett., vol. 12, No. 4, APRIL 1991 pp 181.

-N. Yamauch et al. "Polysilicon Thin-Film Transistors with Channel Length and Width Comparable to or Smaller than the Grain Size of the Thin Film," IEEE Transaction on Electron Device., vol. 38, No. 1, JANUARY 1991 pp 55.

However, the conventional methods have problems. For instance, if the crystal grain size is increased by annealing and so on, there is a problem that the electrical characteristics of the transistor depend heavily on the size of the transistor. When the grain size is enlarged so as to be as large as, or larger than, the channel region in the transistor, the channel region is composed of a monocrystal for the most part, and then its carrier mobility increases. However, since a large transistor includes a plurality of grain boundaries within the channel region, the mobility decreases. That is to say, the minimum size of the transistor needs to be larger than the crystal grain size in order to make carrier mobility substantially independent of transistor size. On the other hand, it is necessary to enlarge the grain size for the purpose of bringing the characteristics of the polycrystalline silicon TFT close to that of monocrystalline silicon. Therefore, the method for increasing the mobility by enlarging the grain size has a problem that the minimum transistor size can not be so decreased. Another problem is that the polycrystalline silicon TFT becomes largely different in characteristics from a transistor which is formed in the same chip and has the same pattern when only a few grain boundaries are included in the channel region. The characteristics of a TFT are highly dependent on the number of grain boundaries. Consequently, it is difficult to realize an integrated circuit composed of a TFT having the same characteristics, especially an integrated circuit including an analog circuit. Further, two kinds of methods can be used for enlarging the grain size: one is high temperature annealing such as laser annealing, and the other is forming an amorphous silicon thin film first and then converting it into the polycrystalline state by annealing. However, the recrystallization rate of silicon depends on a plane structure, or orientation. For instance, the recrystallization rate is substantially different between a 100-plane structure and a 111-plane structure. Accordingly, when an amorphous silicon thin film is converted into a polycrystalline silicon thin film by annealing, substantial irregularities are produced on the surface. As FIG. 3 clearly suggests, projections as high as 20 nm are produced on the surface of the polycrystalline silicon thin film and the surface is very rough. The surface of an a-Si film before annealing is very flat. In the case of a poly-Si film, there are many microcrystalline silicon regions having different crystalline plane structures in the film and further the recrystallization rate due to annealing is dependent on the crystalline plane structure. Therefore, substantial irregularities are produced on the poly-Si surface after recrystallization.

As mentioned above, the thickness of the silicon thin film used for the TFT has been decreased, for example, to approximately 100 nm. However, an irregularity of 20 nm depth remains.

The existence of such large irregularities leads to difficulty in thinning down the gate insulating film. As to the form of the transistor, the irregularity makes it difficult to increase the density of a display or an integrated circuit by way of miniaturizing the TFT. In another method for increasing mobility, i.e. by deactivating defects in the grain boundaries, the defects can not be inactivated completely, so that resulting improvement which can be achieved in the characteristics is limited. Additionally, it is not easy to control the hydrogen introduced for deactivating, which leads to further reliability problems.

SUMMARY OF THE INVENTION

An object of the present invention is to provide a TFT having high current driving performance and a method for manufacturing such TFT.

Another object of the present invention is to provide a TFT which can be reduced in size to allow increased integration density, and a method for manufacturing such transistor.

It is still another object of the present invention to provide a TFT having accurately settable electrical characteristics and excellent productivity, and a method for manufacturing it.

It is a further object of the present invention to provide a high density SRAM and a small active matrix type liquid crystal display panel with a built-in driving circuit which are composed of TFTs having excellent electrical characteristics and being suitable for high integration densities.

It is a still further object of the present invention to provide a highly integrated semiconductor circuit and a three-dimensional integrated circuit having a multilayer structure which are composed of TFTs having excellent electrical characteristics and suitable for high integration densities.

In order to achieve the above and other objects, the present invention discloses a polycrystalline thin film transistor comprising a polycrystalline semiconductor film, a gate insulating film and a gate electrode film, which has a flattened interface between the polycrystalline semiconductor film and the gate insulating film or a flattened interface between the gate electrode film and the gate insulating film, and also provides a method for manufacturing the transistor.

DESCRIPTION OF THE PREFERRED EMBODIMENTS

The following is a description of embodiments which achieve the above-mentioned objects of the present invention.

Figure 1:
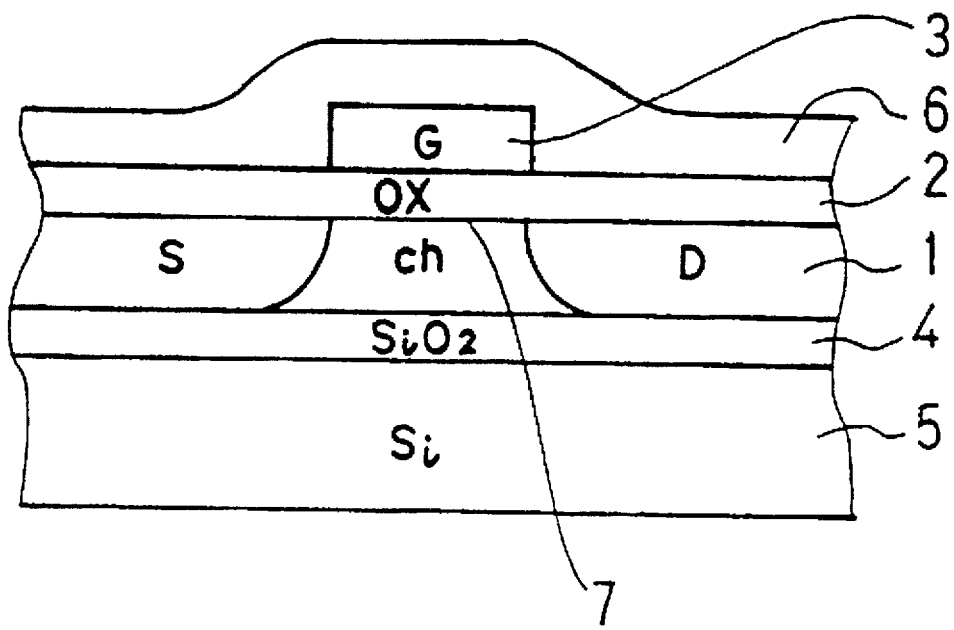
FIG. 1 is a simplified sectional view showing a basic structure of a TFT device according to the present invention.

FIG. 1 shows a basic structure of a TFT device according to the invention. This TFT device has a structure composed of at least three layers, that is, a semiconductor layer 1, an insulating layer 2 and a conductive layer 3. This three-layer structure is formed on an insulating base film 4 which is in turn formed on a backing substrate 5. The base film 4 is made of, for instance, $SiO_2$, and the backing substrate 5 is made of, for instance, monocrystalline silicon Si.

In the semiconductor layer 1 are formed a channel region ch, and a source region S and a drain region D on respective opposite sides of channel region ch. The semiconductor layer 1 is composed of, for example, a semiconductor thin film (i.e. with a thickness not greater than 0.5μ) deposited on the base film 4, or is composed of polycrystalline silicon (poly-Si). On the other hand, the conductive layer 3 is patterned and forms a gate electrode G. A polycrystalline thin film is used, for example, as the material of the conductive layer 3. The insulating layer 2 intervening between the semiconductor layer 1 and the conductive layer 3 forms a gate insulating film OX. The gate insulating film OX is a silicon dioxide thin film or the like. The TFT having the described multilayer structure is covered by a protection film 6.

The TFT according to this embodiment has a channel region composed of a poly-Si thin film. Therefore, there are many microcrystalline silicon regions having different crystalline plane structures through the grain boundaries in the channel region ch. The resistance of the source and drain regions must be low. Metal and semiconductor films can be used for the source and drain regions if they provide low resistance values.

As a characteristic of the present invention, the TFT device of FIG. 1 has at least a flat interface 7 between the channel region ch and the gate insulating film OX. For instance, the surface roughness of flat interface 7 is approximately a few nm and coincides with irregularities being substantially reduced at the surface layer 1. Even if the thickness of the thin film constituting semiconductor layer 1 is reduced to about 100 nm, the surface roughness of the interface can be kept under a few nm, and it can be said that the interface has a surface which is relatively extremely flat.

Figure 2A:
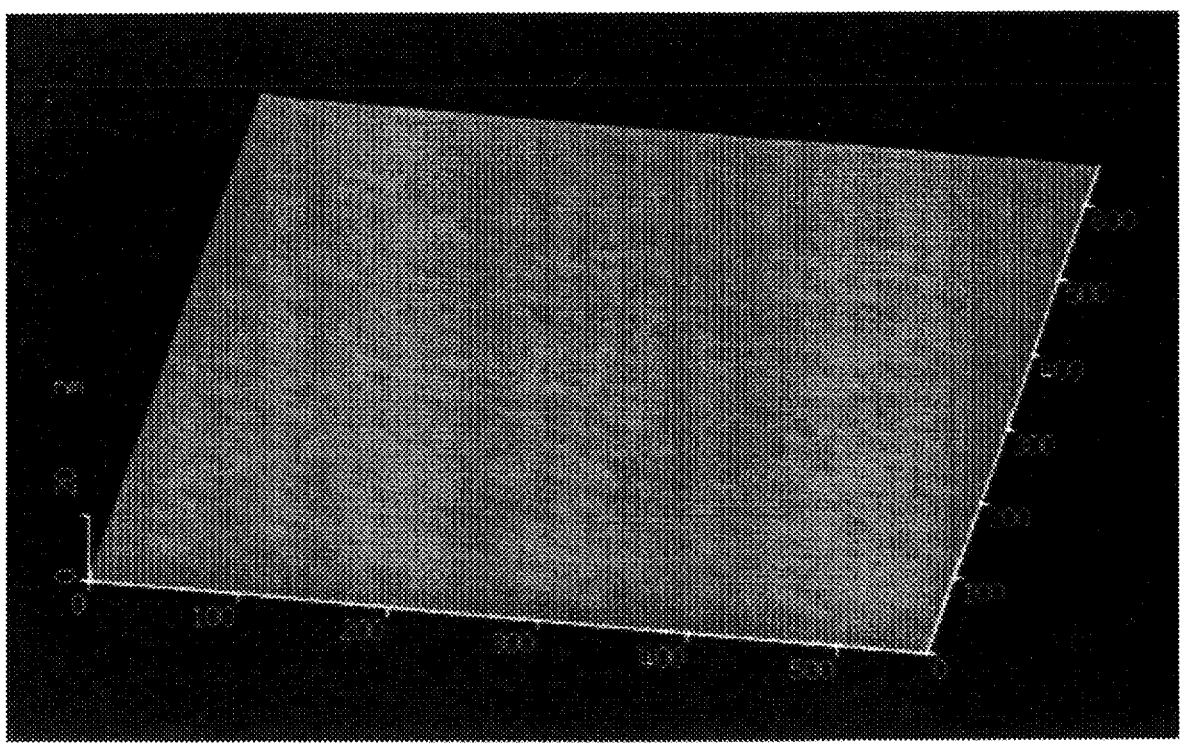
FIGS. 2(a)–(c) are perspective views showing surface states of a-Si film, poly-Si film and bulk crystal silicon respectively.
Figure 2B:
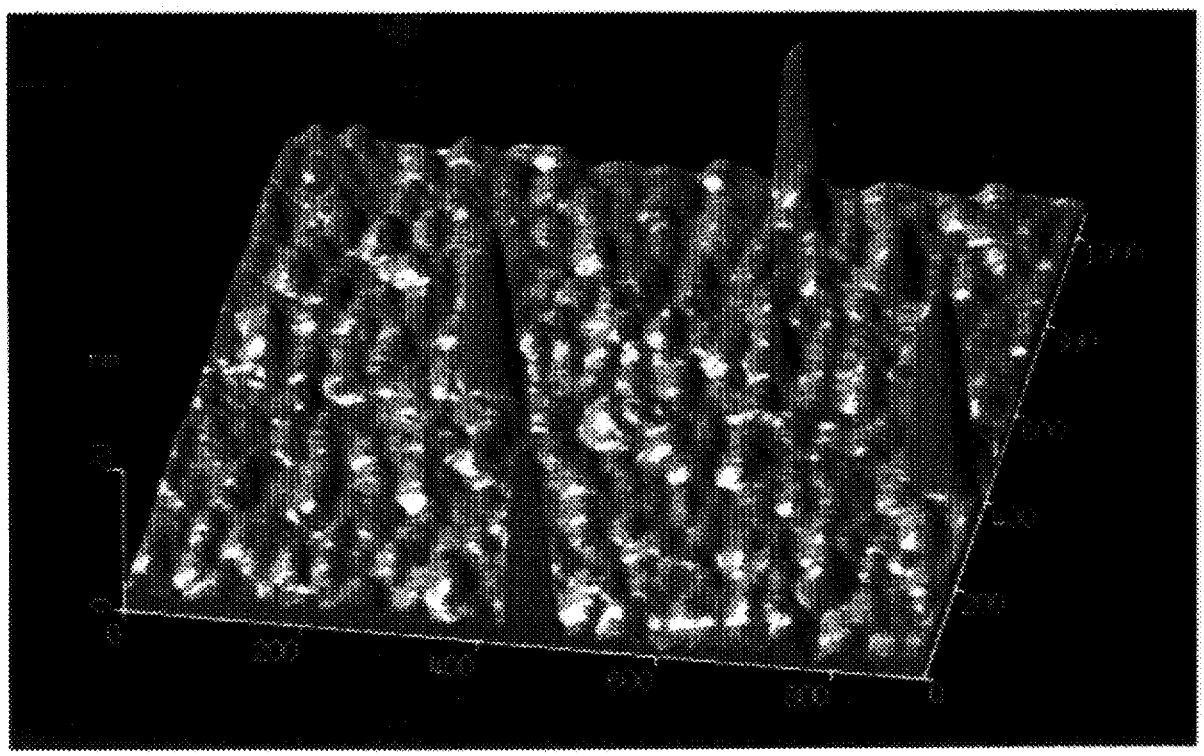
Figure 2C:
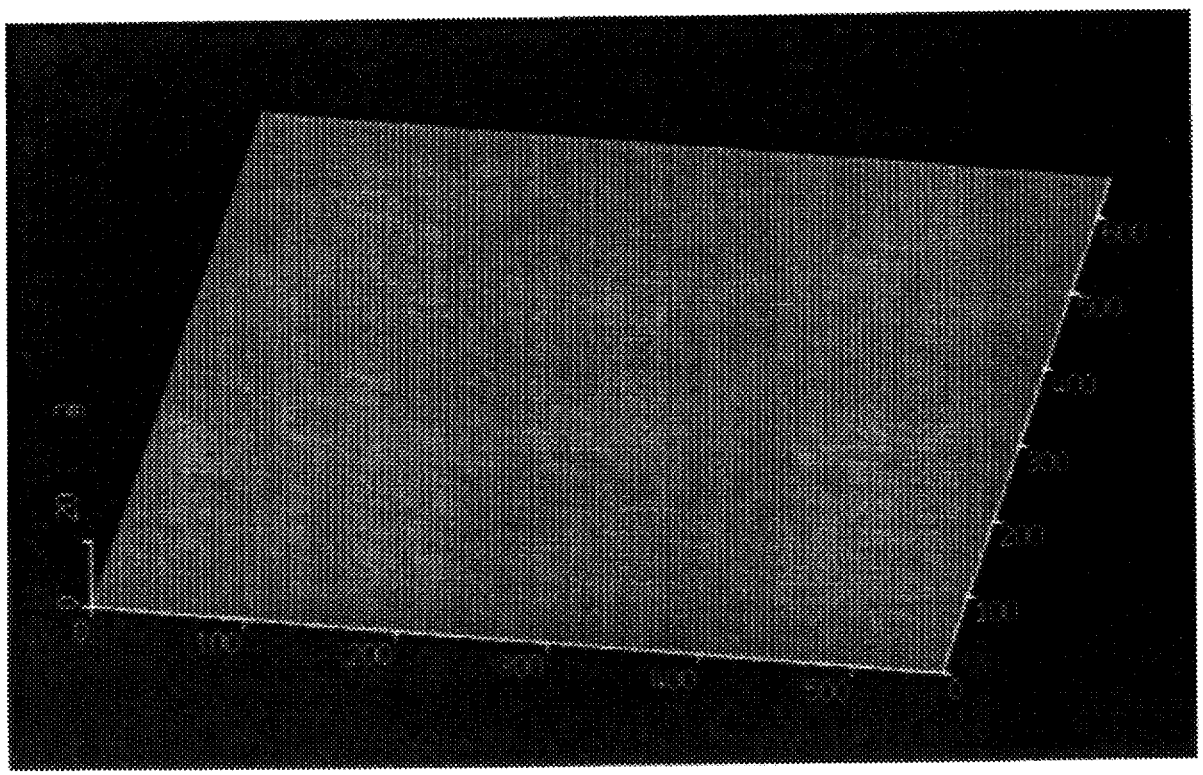

FIGS. 2(a), (b) and (c) are perspective views showing surface states of different crystalline materials formed into films by conventional processes. FIG. 2(a) shows a surface state of an amorphous silicon film. FIG. 2(b) shows that of a polycrystalline silicon film and FIG. 2(c) shows that of bulk crystal silicon. These views are obtained by observation with an AFM (atomic force microscope). As is apparent from FIGS. 2(a), (b) and (c), the amorphous silicon film and the bulk crystal silicon can be formed very flat within the scope of transistor sizes so that the irregularity of their surfaces is 1 nm or less in depth.

However, the irregularities greater than about 10 nm in depth exist at the surface of the polycrystalline silicon thin film formed by the conventional method. Though a lower surface of the polycrystalline silicon film is flat, on its upper surface there are irregularities of about 10 nm or more in depth. These irregularities exist because the film is polycrystalline. In other words, the irregularities are produced as a result that a plurality of crystals having different planes grow around respective nuclei when the film is formed. Therefore, the level of the film's recrystallization increases, and the irregularity becomes deeper, when a further thermal oxidation is performed on a polycrystalline thin film which has been formed, for example, at 600° C.

Figure 3:
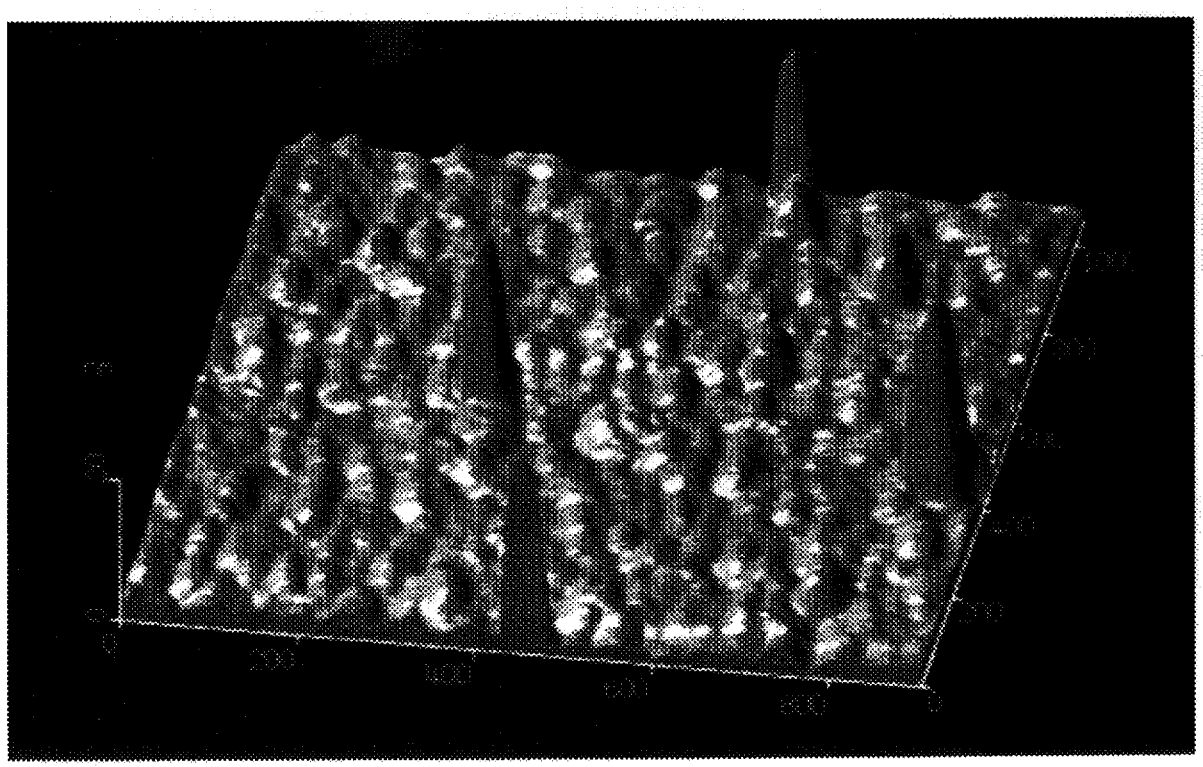
FIG. 3 is a perspective view showing the surface state of a recrystallized poly-Si film.

FIG. 3 shows the surface state of a polycrystalline silicon thin film which is obtained by recrystallizing an amorphous silicon film by one hour of heat treatment at 900° C. When the amorphous silicon film is crystallized by heat treatment, crystallization advances efficiently. Consequently, the irregularity grows to approximately 20 nm in depth as shown in FIG. 3. In other words, as the crystal grain size is made bigger by heat treatment, the irregularity on the surface becomes deeper.

Further, in the case of a polycrystalline silicon TFT, generally a thermal oxidation film considered to be excellent in quality is used as the gate insulating film. The irregularity of the polycrystalline silicon film is also increased by the thermal oxidation step used to form the gate insulating film; thermal oxidation rate largely depends on the crystal planes.

Ion implantation is used as one of the methods for flattening interface 7. Or, the interface is flattened by polishing. Further, growth of projections on the irregular surface may be prevented by coating a cap when the thin film is annealed. This method is called capping.

It is necessary that the surface roughness of base film 4 and further of backing substrate 5 under the interface 7 be kept under a few nm in order to keep the surface roughness of the interface 7 in the channel region under a few nm. In TFTs of the type under consideration, the size of the channel region ch is of the order of about $1\mu^2$.

As described above, flattening the surface roughness of the interface 7 to less than a few nm can result in increasing the current drivability to about 5 times that of the conventional TFT. In the present invention, the high current drivability characteristic is independent of the grain size. Then, the TFT according to the invention is furthermore useful in the case that there are many grains over 10 in the channel region. Variations in the current drivability characteristic are very low in the case of TFT devices having many grains in the channel region.

The TFT shown in FIG. 1 has a so-called original three-layer structure. In other words, the conductive layer 3, the insulating layer 2 and the semiconductor layer 1 are created from top to bottom. This type of TFT is used as, for example, a polycrystalline silicon TFT for a driving substrate of an active matrix type liquid crystal display panel.

Figure 4:
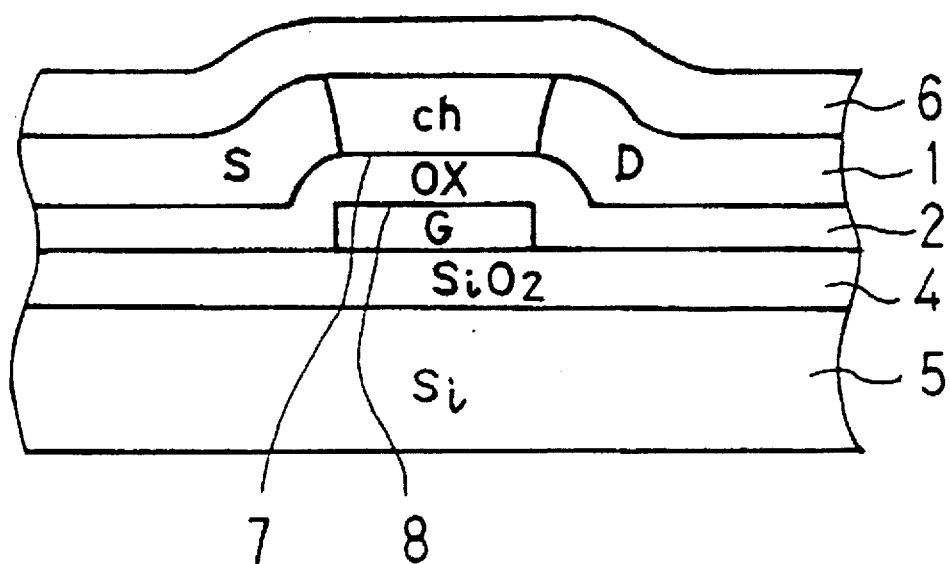
FIGS. 4, 5, 6 and 7 are simplified sectional views showing further embodiments of the TFT device according to the present invention.

FIG. 4 shows another example of a TFT structure according to the invention. In order to facilitate understanding, the same elements as those used in FIG. 1 are identified with the same reference numbers or symbols as in FIG. 1. The TFT in this embodiment has a three-layer structure which is reverse to the original three-layer structure in FIG. 1, that is, a semiconductor layer 1, an insulating layer 2 and a conductive layer 3 are created from top to bottom. A TFT having this reverse three-layer structure can be used for the above-mentioned SRAM and so on.

In this embodiment, an interface 7 between a channel region ch and a gate insulating film OX is flattened by the means such as those previously described. Additionally, an interface 8 between the gate insulating layer OX and gate electrode G is also flattened. Accordingly, the thickness of the gate insulating layer OX is uniform also.

In order to form a TFT having the reverse three-layer structure, the gate electrode G, the gate insulating film OX and the channel region ch are formed in this order, respectively, and the surface state of the interface 8 affects that of the interface 7 to be formed later. Specifically, it is difficult to make the upper interface 7 flat while the lower interface 8 remains rough from the viewpoint of manufacturing process. This problem can be solved by flattening the interface 8 in advance, and then forming the gate insulating film and flattening the interface 7. Especially, in the case of a gate electrode G composed of a poly-Si film, the surface roughness of the gate electrode G is more than 10 nm. The resistance value of the gate electrode G is generally low. Therefore, the surface roughness of a high impurity concentration gate electrode is larger than that of a low impurity concentration gate electrode. The grain size increases with the impurity concentration of a poly-si film so that the surface roughness increases with the concentration also. Therefore, it is necessary to flatten the surface roughness of the gate electrode to under 2 nm by the flattening process when the impurity concentration of a poly-si film is more than $10^{20}$ atoms/cm$^3$. A crystallized poly-Si film with a low impurity concentration less than $10^{20}$ atoms/cm$^3$ is better as the gate electrode film.

Figure 5:
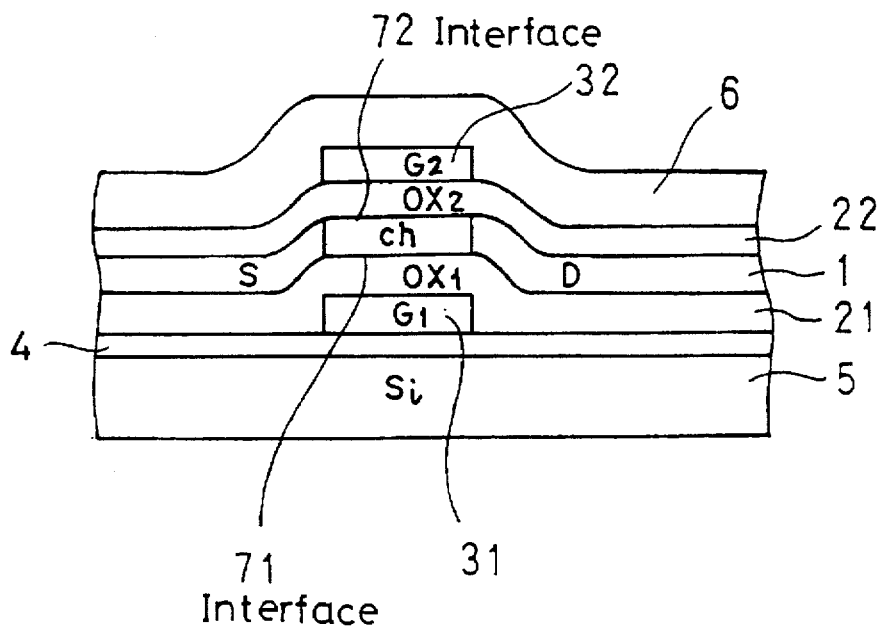

FIG. 5 shows a further structural example of the invention. The same elements as those used in the above-described example are indicated with the same reference numbers or symbols for easy understanding. This embodiment includes a so-called double-gate structure, or a double three-layer structure. In other words, a pair of insulating layers 21, 22 are arranged below and above a semiconductor layer 1 in the middle, respectively. Further, a pair of conductive layers 31, 32 are formed under the insulating layer 21 and on the insulating layer 22 respectively. In this way a channel region ch is sandwiched between a pair of gate electrodes G1, G2 from both sides through gate insulating films OX1, OX2.

As this structure has two interfaces, an electrical characteristic of the semiconductor layer can be improved more by flattening the interfaces.

The surface roughness in the region of a chip is more than a few nm. It is important to flatten the surface roughness not in the region of a chip, but in the channel region in order to improve the electrical characteristics.

When the channel region ch is controlled from both sides in the double-gate structure of FIG. 5, the electrical characteristics of a TFT can be improved much more by the present invention. To the extent that the interfaces 71, 72 above and below the channel ch are flattened, the electrical characteristics can be improved even when a thin film substrate is not used. Further if a thin film is used in the above case, the improvement in electrical characteristics is greater than the sum of the improvements in two cases, when both interfaces are flattened and when a thin film is used, respectively.

When semiconductor film 1 is made thinner and gate electrodes 31, 32 are provided on both sides of the semiconductor film 1 through flat interfaces 71, 72, respectively, electric charges in the channel region ch are controlled by the two gate electrodes through the interfaces on both sides. As a result of the electrical characteristics obtained, this structure has twice the current drivability obtained in the structure with one gate electrode, or more. It is necessary that the thickness of the semiconductor film 1 is smaller than the width of a depletion layer which depends on the impurity concentration of the semiconductor film in order that the gate electrodes 31, 32 on both sides may efficiently control the channel region ch. The electrical characteristics are remarkably improved by making the semiconductor film 1 thinner than the width of the depletion layer.

Figure 6:
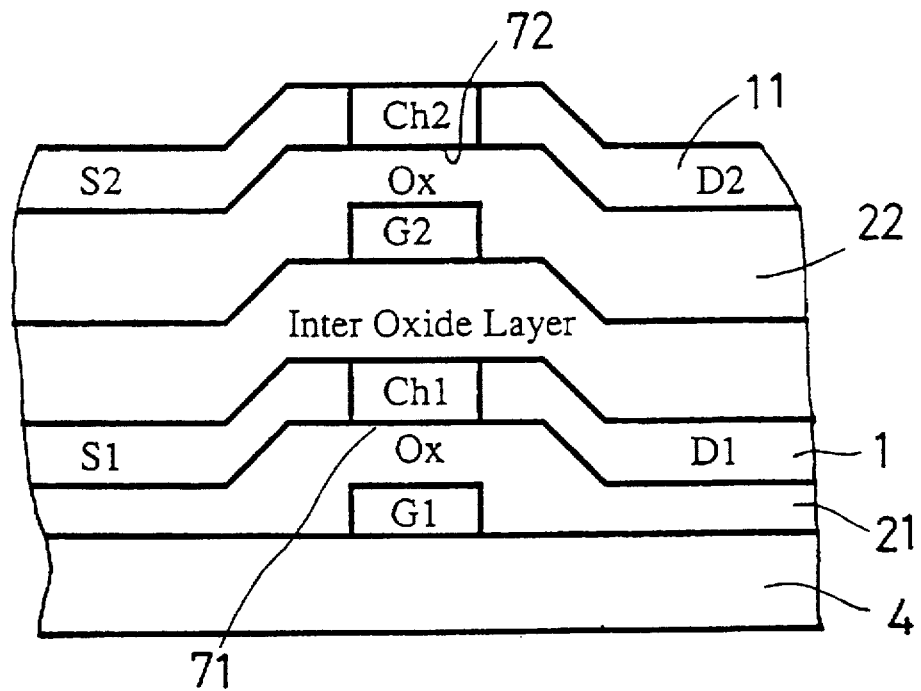

FIG. 6 shows another structural example of the invention. In this structure, the thin film transistor shown in FIG. 4 is piled on top of another transistor of identical structure. Generally, in a TFT having such a piled-up structure, the irregularity in the upper TFT is influenced by that in the lower TFT, and becomes more pronounced. Accordingly, as the number of piled TFTs increases, the electrical characteristics of the TFT on top becomes worse. However, in the present invention, a TFT formed on the inventive flattened TFT also has excellent electrical characteristics. Therefore, a plurality of piled-up semiconductor integrated circuits can be realized by use of the inventive TFT.

Figure 7:
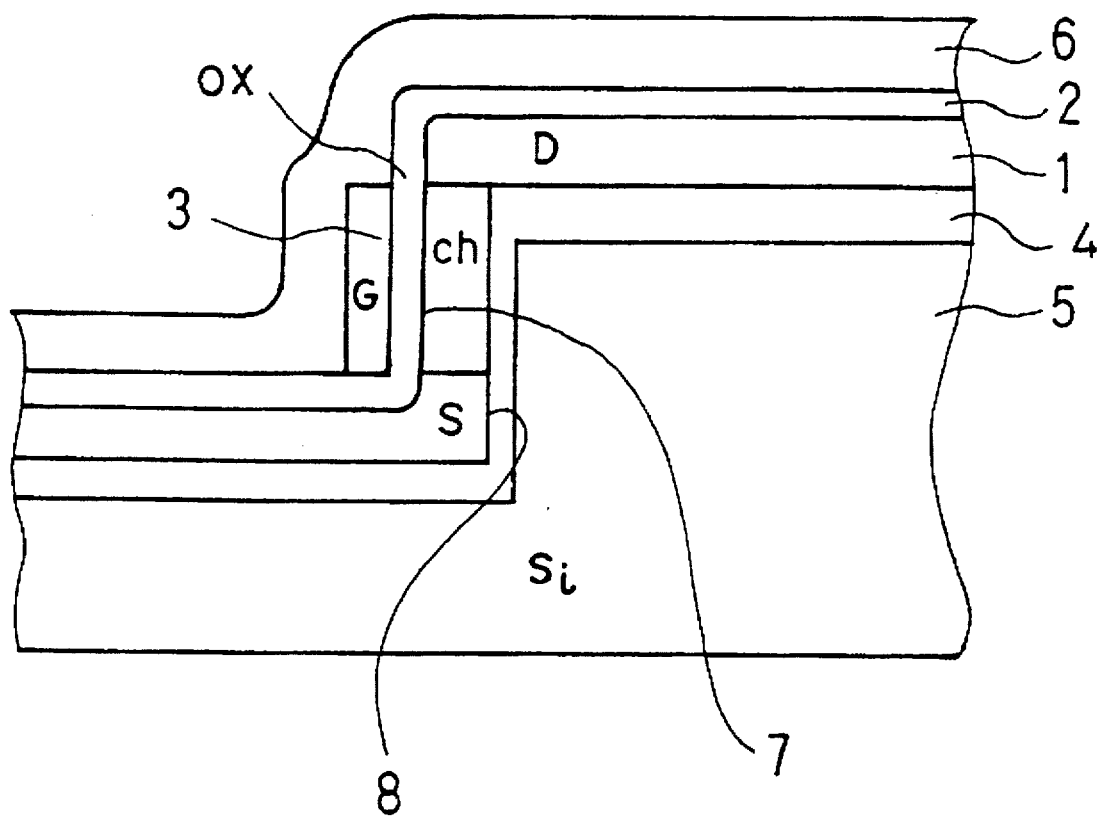

FIG. 7 shows a further example of the invention. To facilitate understanding, the same elements as those used in the previous example are identified with the same reference numbers or symbols. In this example, a TFT having a three-layer structure is formed vertically along a step portion 8 provided on a substrate 5. Step portion 8 may define the edge of a groove or mesa of substrate 5. In this case, an interface 7 between a channel region ch and a gate insulating film OX is flattened by any of the means mentioned above. By forming the TFT along the step portion 8 in such a way the utilizable area of the substrate 5 increases three-dimensionally, and further high integration can be realized.

Figure 8:
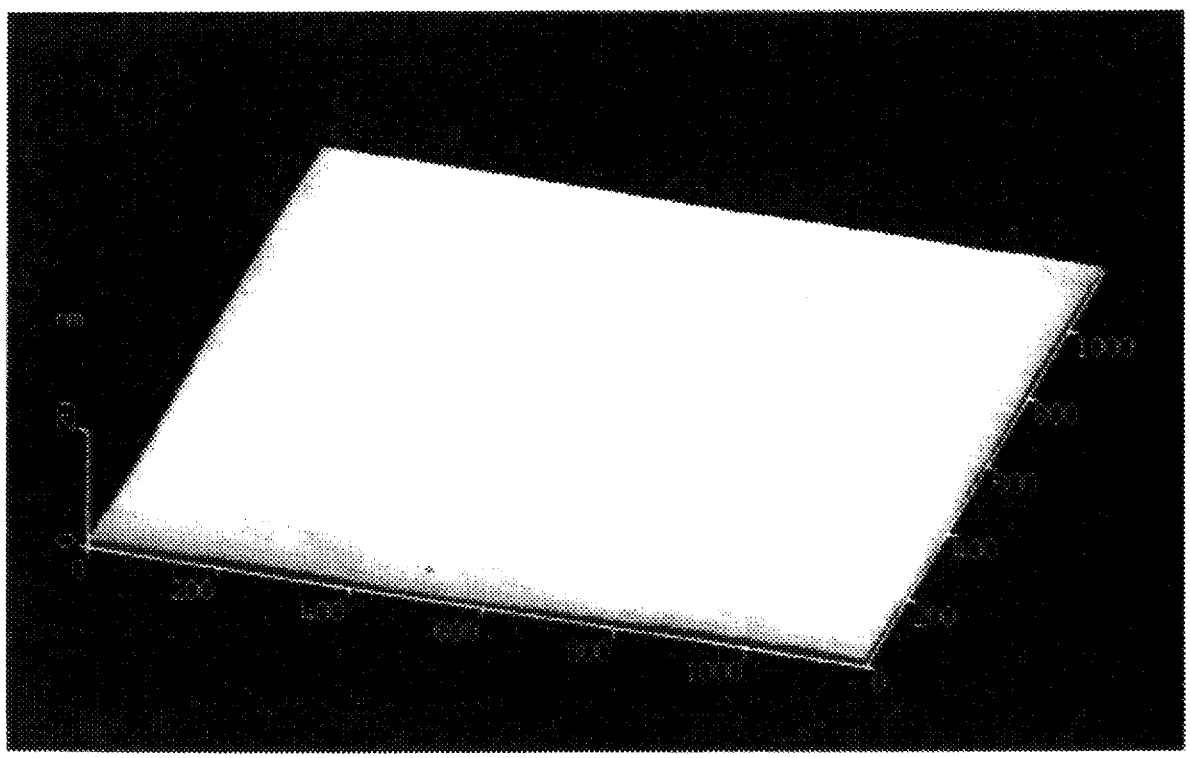
FIG. 8 is a perspective view showing the surface state of a flattened poly-Si film.

FIG. 8 shows the surface state of a flattened semiconductor layer, that is the surface of a semiconductor layer composed of a polycrystalline silicon thin film which has been flattened by polishing mechanically. It is found that this surface is remarkably smooth compared with the original state before polishing shown in FIG. 3. There were projections as high as 20 nm before flattening, but they have substantially disappeared after flattening.

The surface states shown in FIG. 3 and FIG. 8 are what are measured by an atomic force microscope (hereinafter referred to as "AFM")and are represented as a simple model. The AFM is a microscope for visualizing a surface state of a sample by making use of the Van der Waals force between a probe and an atom existing on the sample surface, and has an accuracy in the range of a few angstroms. Practically, a cantilever tip is irradiated by a semiconductor laser, and a displacement amount of the probe provided on the tip of the cantilever is detected from the position of reflected light of a semiconductor laser. The distance between the probe and the atom on the sample is controlled by a piezoelectric element so as to keep constant the Van der Waals force or repulsion acting between the probe and the atom on the sample.

Figure 9A:
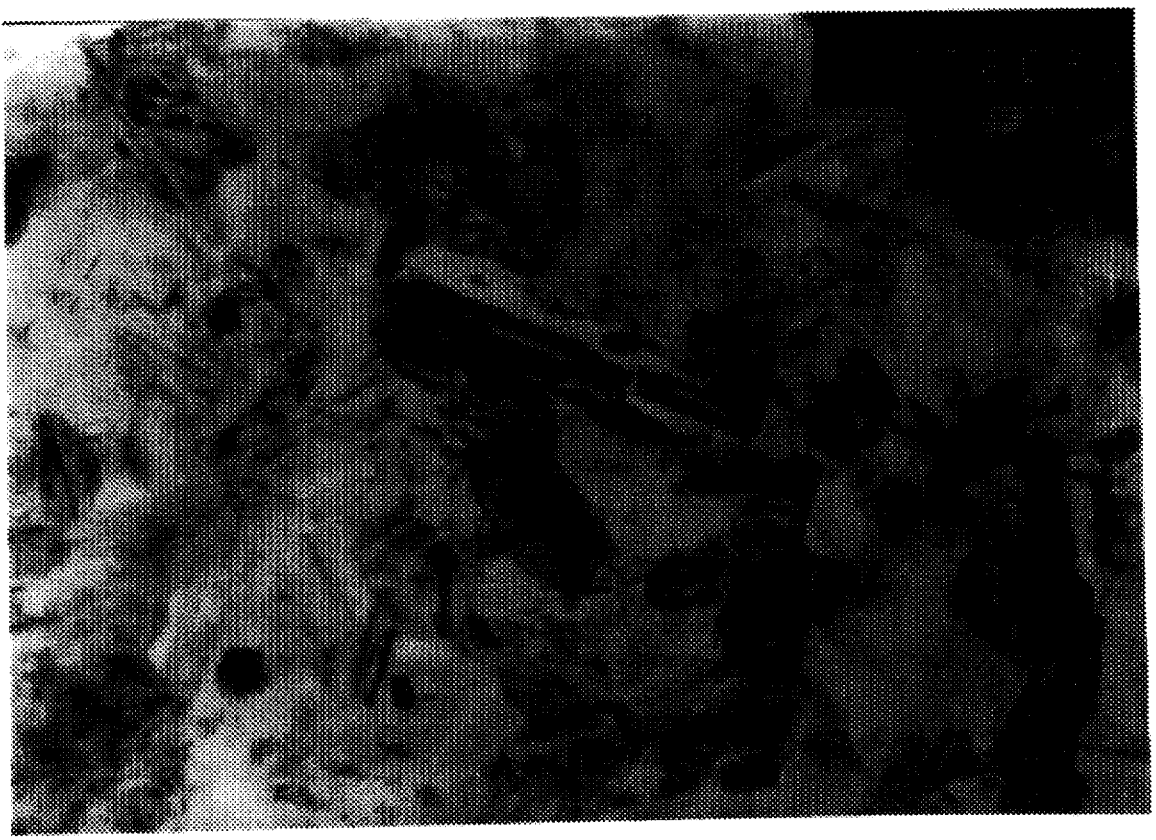
FIGS. 9(a) and 9(b) are TEM image photographs of not-polished and polished poly-Si films, respectively.
Figure 9B:

FIGS. 9(a) and 9(b) are photographs made by transmission electron microscopy (TEM) to show the grain size and the grain boundary structures of poly-si films. FIG. 9(a) is a TEM image photograph of a poly-Si film which has not been subjected to a flattening process, namely a not-polished poly-Si film. FIG. 9(b) is a TEM image photograph of a flattened poly-Si film, namely a polished poly-Si film. The polishing process as an embodiment of a flattening process was done after recrystallizing the poly-Si film. Therefore, the grain structures must be independent of the polishing process. The grain structures of the polished poly-Si film compares with that of a not-polished poly-Si film in a manner clearly shown in FIGS. 9(a) and 9(b).

Figure 10A:
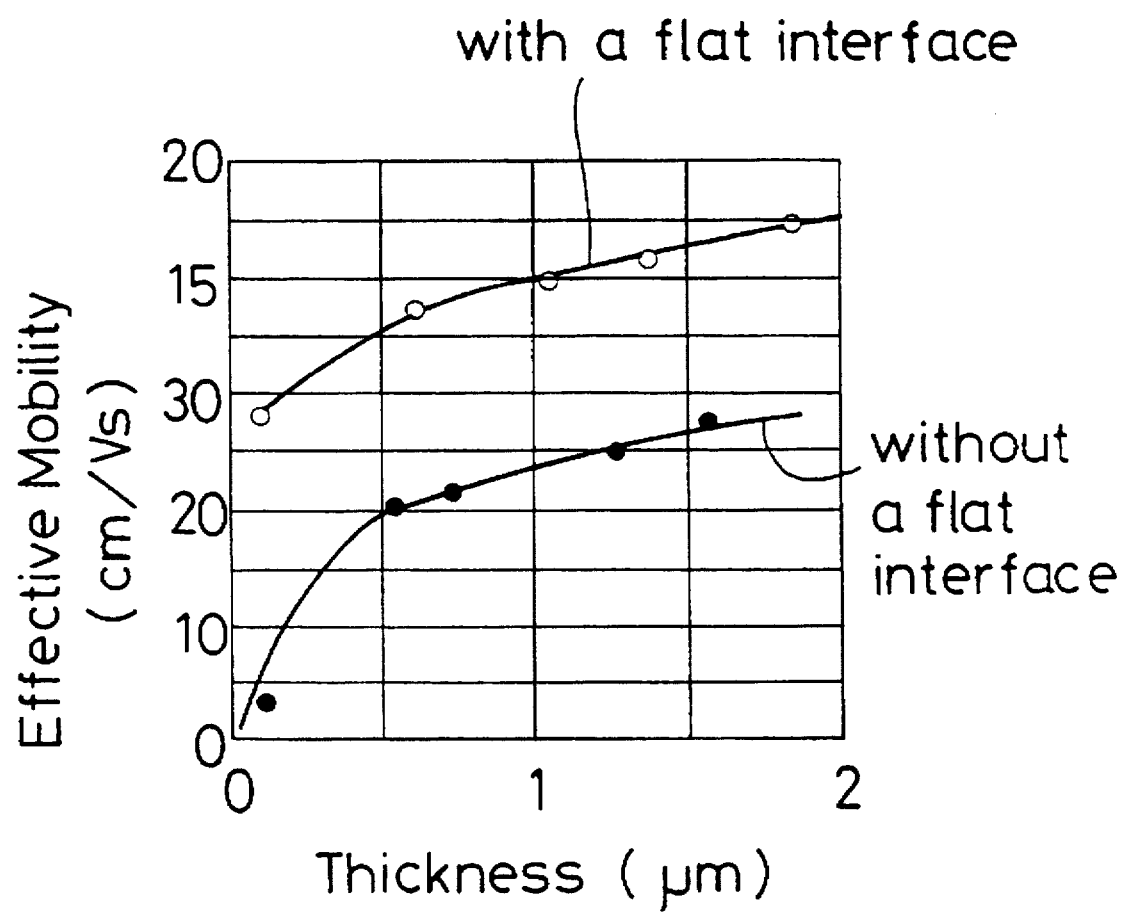
FIGS. 10(a) and 10(b) are graphs showing a relationship between the thickness of a poly-Si film and channel carrier mobility.
Figure 10B:
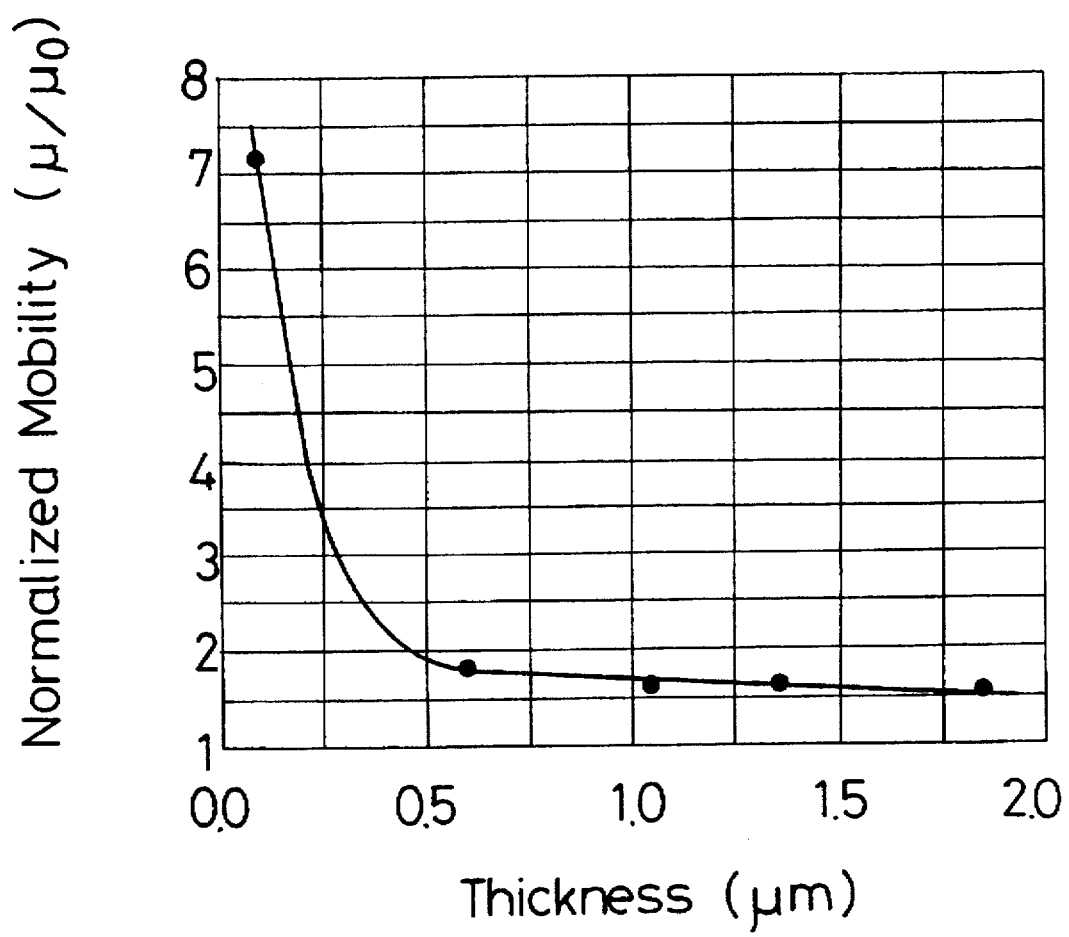

FIGS. 10(a) and 10(b) are graphs showing data obtained by measuring mobility of charges in a semiconductor thin film with and without flattening the interface 7 of FIG. 1. In FIG. 10(a), the horizontal axis represents film thickness (in µm), and the vertical axis represents channel effective mobility (in cm/Vs). In FIG. 10(b), the vertical axis represents the ratio of channel effective mobility after flattening an interface to that when the interface is flattened. As obviously shown by the graphs, the mobility is remarkably larger after flattening than before flattening especially in the case of a thin film. Therefore, in the case of a TFT with a thin channel region, its electrical characteristics are remarkably improved. Especially, in the region of film thickness under 0.3 µm, that is, 300 nm, it is noticeable that the mobility improves relatively. The channel effective mobility is about 10 times larger with flattening than that without flattening in the case of a film thickness around 0.1 µm. Before flattening, there are projections of about 20 nm height when the semiconductor thin film has an average thickness of 0.1 µm, in which case the height of the projections is one-fifth of the film thickness. The effect of flattening the interface increases with decreasing film thickness, especially under 0.1 µm, because mobility is then controlled almost by the interface characteristics.

Thus, the present invention is especially effective when the TFT is greatly miniaturized and the thickness of the semiconductor layer in the TFT is largely reduced. In the region where the film is exceedingly thin, the surface roughness of the interface influences the electrical characteristics of the semiconductor layer to a relatively large extent. This undesirable influence can be removed by flattening the interface. For instance, when the substrate thin film of the TFT is 0.1 µm in average thickness, excellent electrical characteristics can be obtained if the projections are at most 2 nm in height. Accordingly, such excellent characteristics can be obtained if the height of the projections are under approximately 1/50 the thickness of the thin film. Clearly, the improvement of electrical characteristic in the present invention is due entirely to flattening of the interface.

Figure 11:
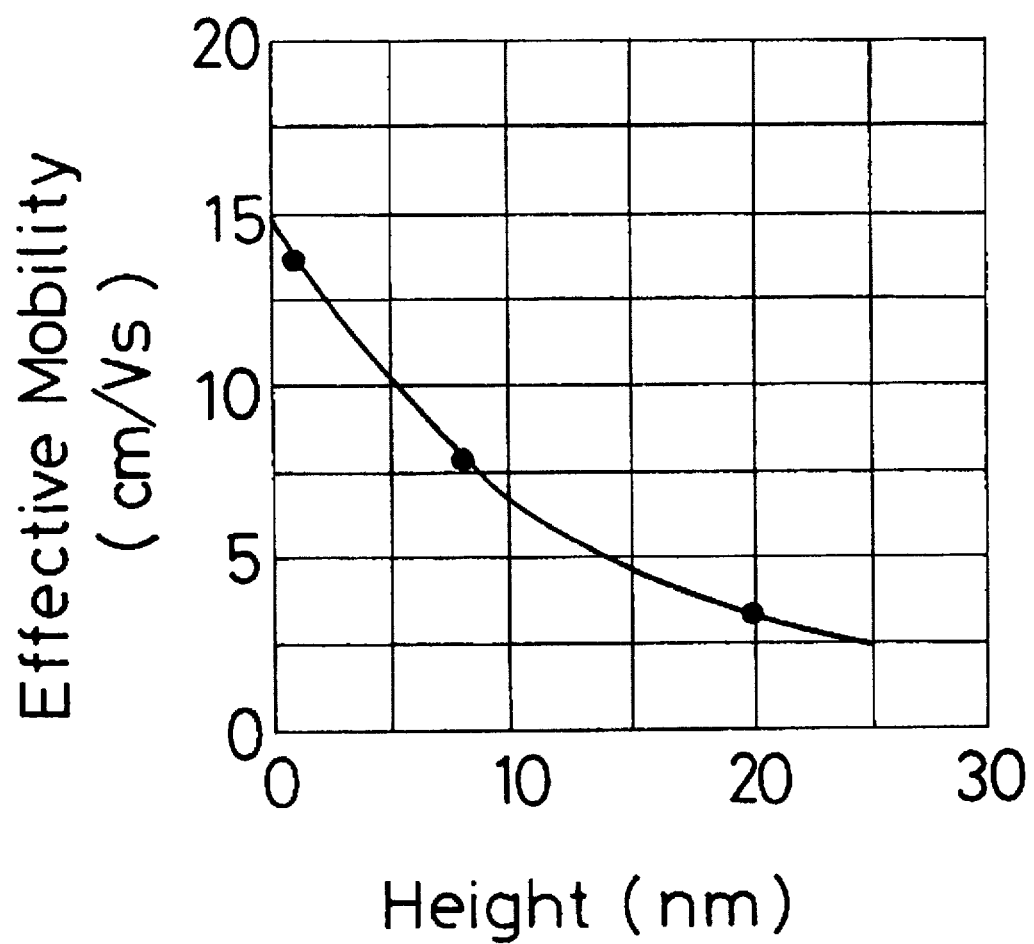
FIG. 11 is a graph showing a relationship between the height of projections existing on a poly-Si thin film surface and channel carrier mobility.

FIG. 11 is a graph showing the relationship between the height of the projections existing on the thin film surface and the effective mobility. In this graph, the horizontal axis represents the height of the projections (in nm), and the vertical axis represents the effective mobility (in cm/Vs). When the interface is flattened, on the surface of the thin film there remain projections, for example, as high as 20 nm (cf. FIG. 3) The mobility in this case is of the order of 7 cm/Vs. On the other hand, if the interface is flattened as shown in FIG. 8, the surface roughness becomes about 3 nm. In this case, the mobility increases to 13 cm/Vs. In other words, if the height of the projections are reduced to 1/50 of the thickness of the substrate layer of the TFT, the mobility becomes about twice that without flattening.

Figure 12A:
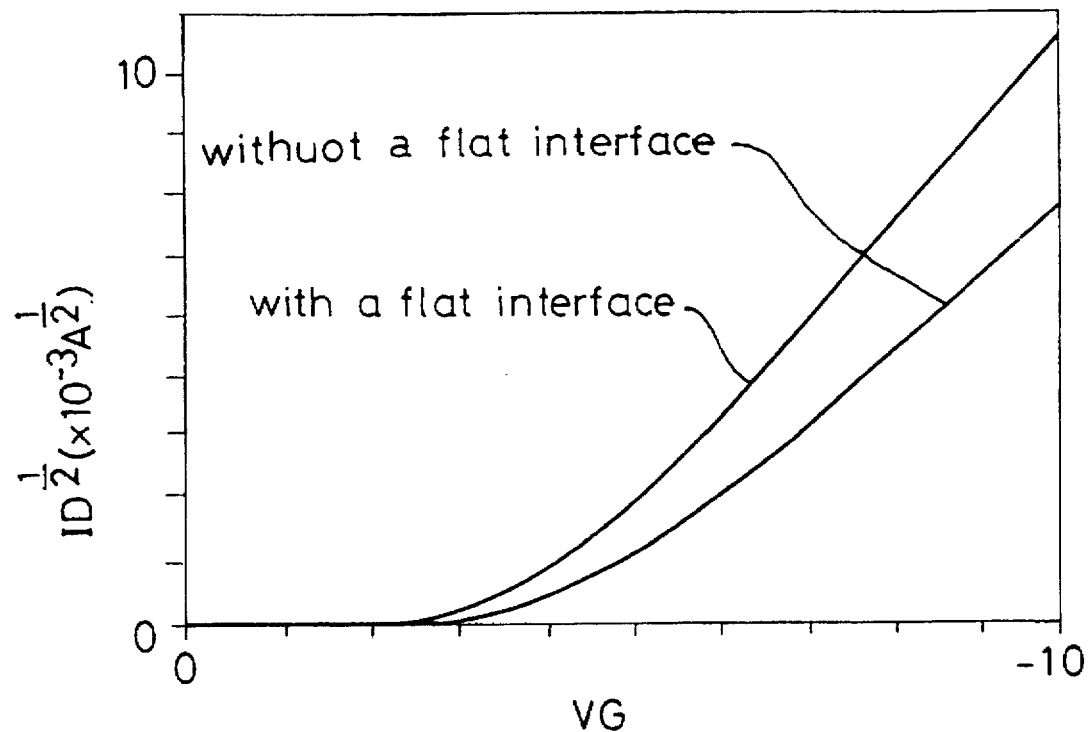
FIGS. 12(a) and 12(b) are graphs showing the current voltage characteristics of a TFT device according to the present invention.
Figure 12B:
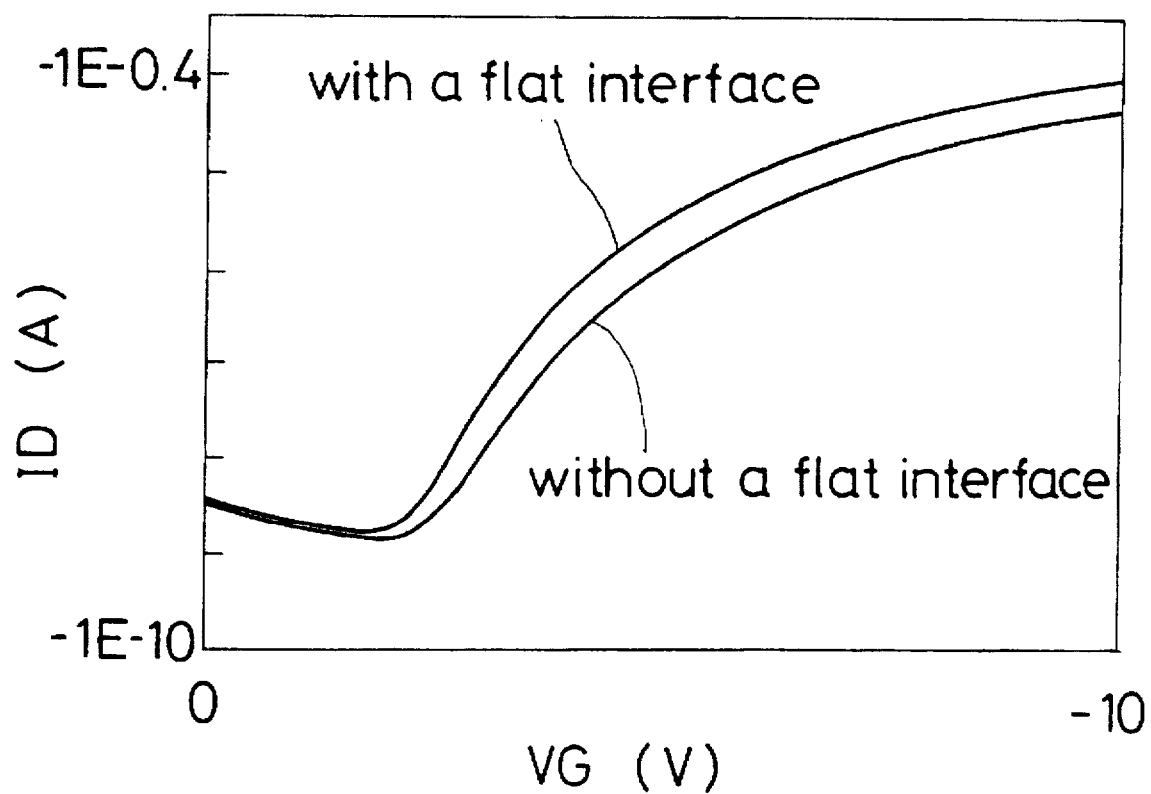

FIGS. 12(a) and 12(b) are graphs showing current voltage characteristics of a TFT having a flattened interface. These graphs also show current-voltage characteristics of a TFT whose interface is not flattened but which is otherwise identical, for comparison. The horizontal axis represents gate voltage, VG and the vertical axis represents drain current, IDD. As is obvious from these graphs, if the interface between the channel region and the gate insulating film is flattened, subthreshold characteristics of the TFT are also improved. As a result, the ON/OFF ratio of the TFT can be highly improved.

Referring to FIGS. 13–17, preferred embodiments of fabrication methods according to the invention will be described in detail.

Figure 13:
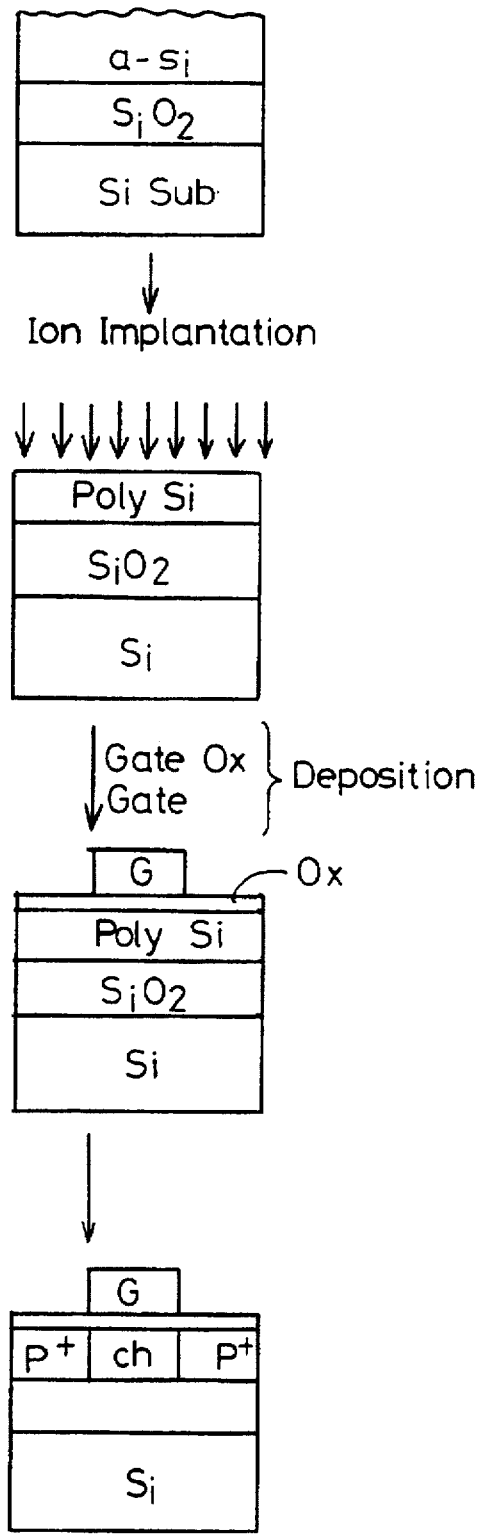
FIG. 13 is a process flow diagram showing a first embodiment of a fabrication method according to the present invention.

FIG. 13 is a process flow diagram representing a first embodiment of the flattening process. First of all, a silicon dioxide film is formed on a surface of a silicon substrate, and an amorphous silicon film is deposited on the $SiO_2$ film by low temperature (less than 590° C.) chemical vapor deposition (hereinafter referred to as "CVD".

Next, ions are implanted into the amorphous silicon film, whose surface roughness, after annealing, will become less than a few nm. Silicon, phosphorus, boron, and so on can be used as ions for this treatment. It is supposed that material changes occur and an interface is flattened by irradiating a surface by accelerated ions. Further, if as the ions, phosphorous generally used as a donor, or boron generally used as an acceptor is implanted, the quality of the film itself is improved in addition to the flattening of the interface. Next, the amorphous silicon film is converted into a polycrystalline silicon film (Poly Si) by annealing or heat treatment.

As means for increasing the crystal grain size, a conventionally well known method is to implant ions at a high dosage of more than $10^{14}$ atoms/$cm^2$. The purpose of the ion implantation in the present invention is not to increase the grain size but to improve the flatness of the surface. Therefore, an optimum dosage of the ions to be implanted is approximately $5 \times 10^{12}$ atoms/$cm^2$, for example, if the film thickness is 0.1 µm. Though the optimum dosage changes depending on the film thickness, it is relatively low, preferably ranging from $10^{11}$ atoms/$cm^2$ to $10^{13}$ atoms/$cm^2$.

Further, when the amorphous silicon film is converted by annealing into a polycrystalline silicon film or a polycrystalline silicon film is converted by annealing into a polycrystalline silicon film having a grain size which is increased by recrystallization, annealing is preferably effected at a high temperature of 900° C. or more. Recrystallization is possible at 600° C. or more in theory. However, if the polycrystalline thin film is recrystallized by many hours of annealing at a low temperature of less than 900° C., irregularities at its surface become much larger as the recrystallization rate is largely different from one crystal plane to another. Therefore, from an aspect of decreasing the irregularity of the surface, annealing is preferably performed at high temperature in a short time, less than ten seconds, like lamp annealing.

Then, a gate insulating film OX and a gate electrode G are formed on the flattened surface of the polycrystalline silicon film. The gate insulating film OX is preferably formed by CVD rather than by thermal oxidation for maintaining the flatness of the interface of the polycrystalline silicon thin film. If the gate insulating film OX is formed by thermal oxidation, irregularities are produced at the surface, that is at the interface of the polycrystalline silicon thin film, because of thermal oxidation rate dependency on planes. Additionally, not only the interface has irregularities but also the thickness of the gate insulating film itself becomes nonuniform. For instance, when a polycrystalline silicon thin film is oxidized by burning hydrogen at 900° C., if an oxide film of about 500 Å thick forms on the (100) plane, an oxide film as thick as about 750 Å is formed on the (111) plane. Consequently, an irregularity of about 10 nm or more in depth is produced by thermal oxidation alone in this case. Diffusion controlled oxidation should be employed to carry out thermal oxidation, since this produces a result which does not vary greatly from one crystal plane to another. In addition, dilution dry oxidation is preferable to oxidize the polycrystalline silicon thin film by controlling with diffusion in the silicon dioxide film. Concretely, when oxygen is diluted to 10% or less with an $N_2$ gas and the thin film is oxidized with diluted oxygen at 1000° C. or more, less irregularity is produced. To decrease the irregularity further, an oxide film is deposited by CVD. Next, the CVD oxide film is annealed in order to decrease the diffusion coefficient of oxygen, and then thermal oxidation is carried out. As the CVD oxide film is formed on the polycrystalline silicon thin film in advance in this way, the oxidation of the polycrystalline silicon thin film surface is controlled by the diffusion. When the oxygen diffusion coefficient of the CVD film is large, the oxidation is controlled by reaction of the polycrystalline silicon thin film with diffused oxygen, so that deeper irregularities are produced.

As the CVD film is theoretically a deposited film, the film itself is flat. When a nitride film is formed as the CVD film, interface levels existing on the interface with the polycrystalline silicon film increase in number. Therefore, a two-layer structure is desirable, which is produced by forming an oxide film on a polycrystalline silicon thin film and then depositing a nitride CVD film thereon. If a thermal oxidation step is additionally performed on the nitride CVD film, insulating performance increases.

Further, the preferred temperature to form the CVD film is 900° C. or less at which recrystallization of the polycrystalline silicon film occurs only to a limited extent.

Lastly, impurity is doped with patterned gate electrode G as a mask.

When the amorphous silicon film doped with ions is converted into a polycrystalline state by annealing, the surface becomes irregular as shown in FIG. 3. However, it can be flattened by subsequent ion implantation.

Figure 14:
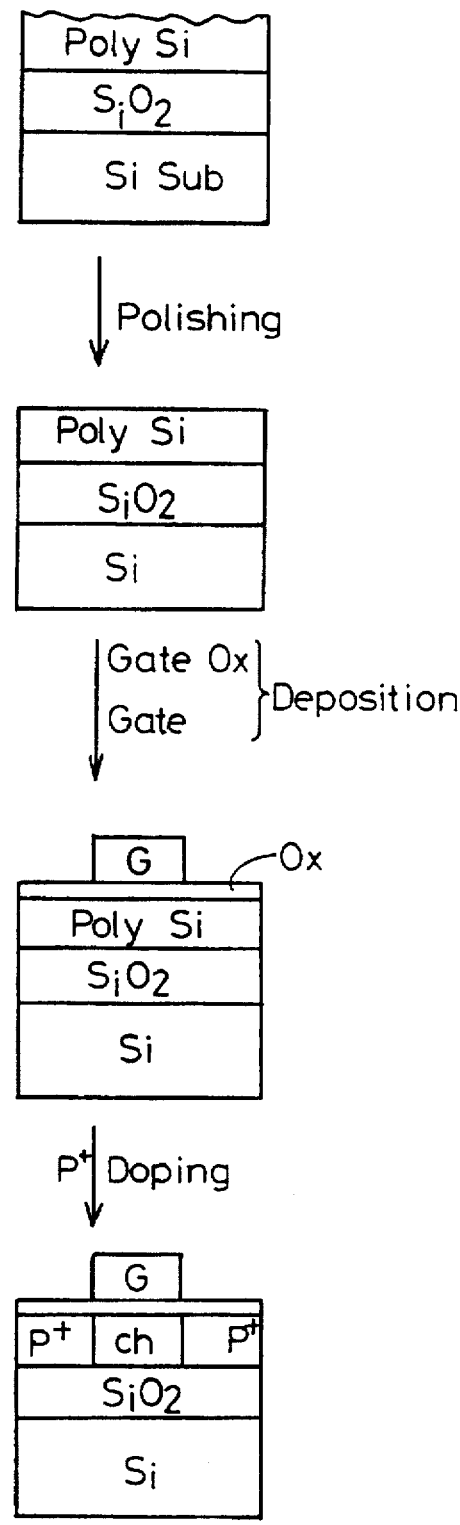
FIG. 14 is a process flow diagram showing a second embodiment of a fabricating method according to the present invention.

Referring to FIG. 14, a second embodiment of the flattening process will be described. In the same way as the embodiment shown in FIG. 13, first a polycrystalline silicon thin film is formed. On its surface, significant projections 20 nm in height are present.

Then, the surface of the polycrystalline silicon thin film is flattened by mechanical polishing, and thereby the surface which is to be a channel region has a roughness of less than a few nm. Exceedingly fine abrasive grains are used for this polishing step. The surface may be further flattened by carrying out chemical etching at the same time as, or after, this polishing. This chemical etching is the same as general silicon etching, and a mixed liquor of hydrofluoric acid (HF) and nitric acid (HN03) can be used.

After the surface is polished, a gate insulating film OX and a gate electrode G are formed in sequence. Finally, a p-type impurity is doped by ion implantation and so on to form a p-channel MIS transistor.

Figure 15:
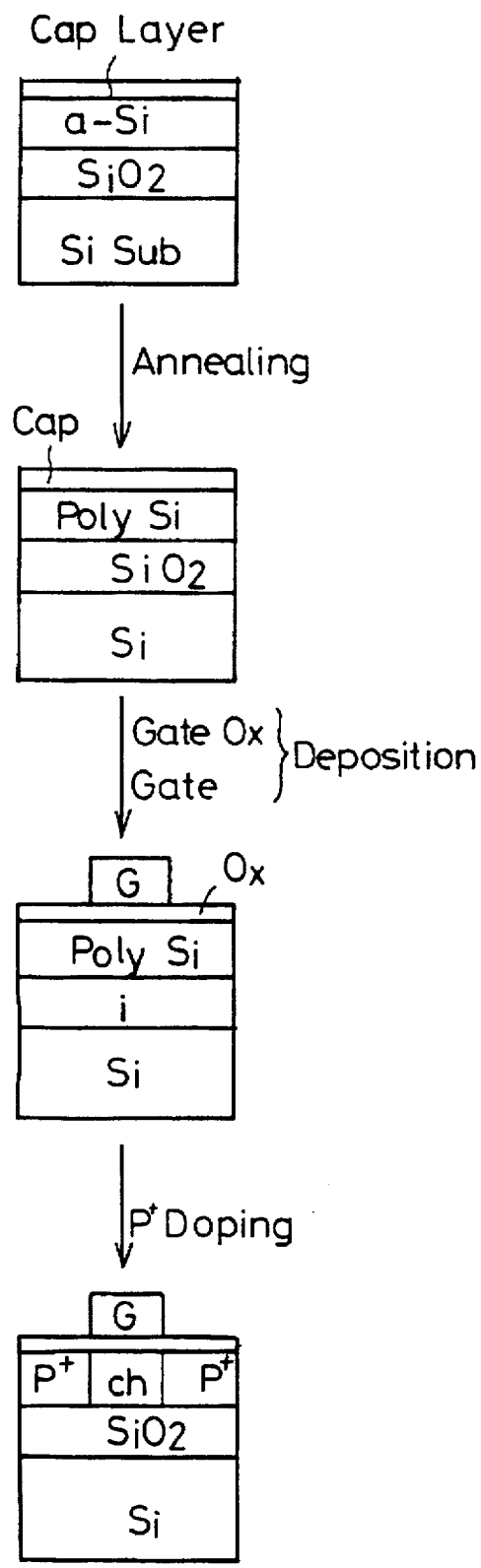
FIG. 15 is a process flow diagram showing a third embodiment of a fabricating method according to the present invention.

FIG. 15 shows a third embodiment of the flattening process. First of all, an amorphous silicon thin film (a-Si) is deposited on a silicon dioxide film which covers a surface by a low temperature CVD. This surface is comparatively flat from the beginning. A cap layer is formed on the amorphous silicon thin film. As the amorphous silicon thin film is formed at 590° C. or less, the cap layer is preferably formed at as low a temperature as possible so as to not affect the amorphous silicon film, at 850° C. or less at the highest and desirably at 590° C. or less. If a poly-Si film is annealed above 850° C., the grain size of the poly-Si film suddenly increases with the annealing temperature.

Then, the amorphous silicon thin film is converted into a polycrystalline silicon thin film by annealing. The temperature of the heat added for this treatment is between 850° C. and 1200° C. Though the crystal grain size increases as a consequence of the annealing, projections do not grow since they are pressed down by the cap layer. It is desirable that the thickness of the cap layer be thicker than that of the poly-Si film. Therefore, the initial flat surface remains as it was. The cap layer is removed from the thin film after the annealing is completed, or the cap layer may be left as it is to be used as a gate insulating film and so on.

As a cap layer, an oxide film or a nitride film can be used, for instance. The nitride film is a dense film, so that it is very effective in preventing the polycrystalline silicon film from recrystallizing vertically. Therefore, the nitride film is suitable for a cap layer. However, it has a drawback, regarding removal of the cap layer, that the ratio of the nitride film to the polycrystalline silicon film with regard to etching rate is small. So, a two-layer structure is more preferable in which an oxide film serving as an etching stopper is formed on the polycrystalline silicon thin film and the nitride film is formed as a cap layer on the oxide film. Then, a gate insulating film OX and a gate electrode G are deposited. Further, p-type impurity is doped over the cap layer with the gate electrode G as a mask in order to produce a MIS transistor.

Figure 16:
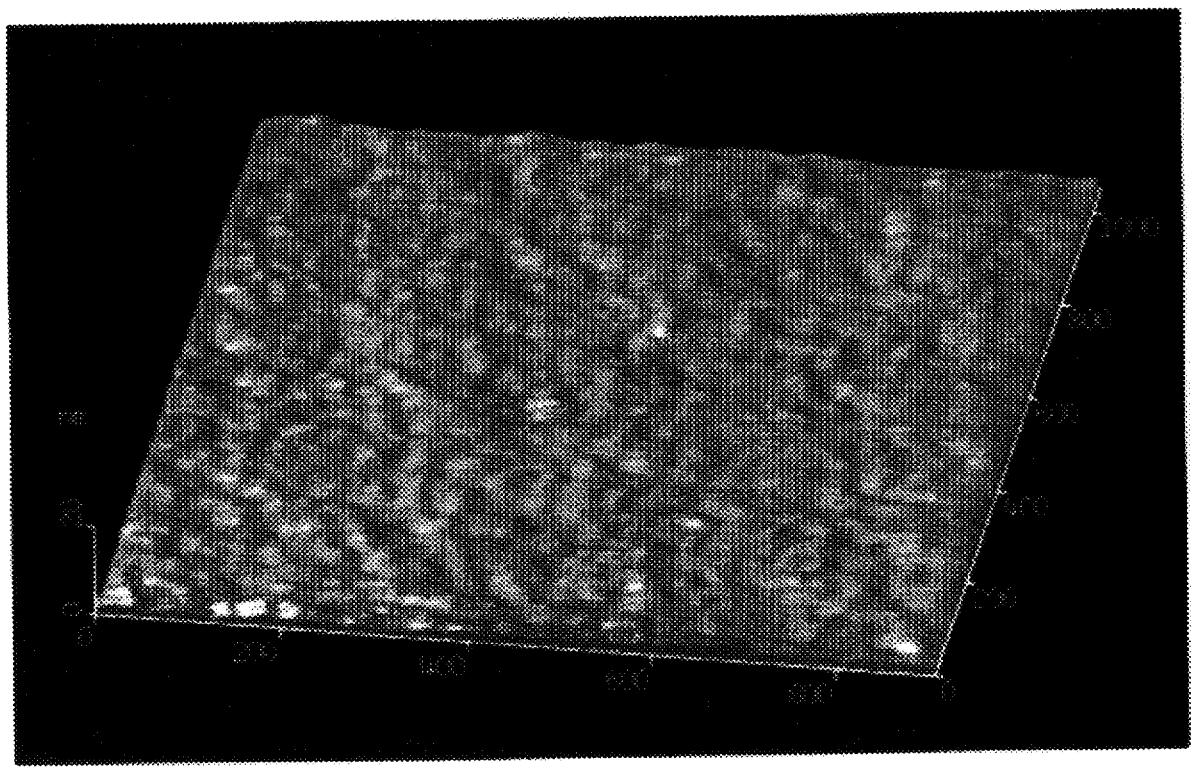
FIG. 16 is a perspective view showing the surface state of a flattened poly-Si film produced by the process of FIG. 15.

FIG. 16 is an AFM image photograph showing the surface state of a polycrystalline silicon thin film which is obtained by a process of flattening the surface by using a cap layer as shown in FIG. 15 according to the present invention. Further, this sample is ion-implanted with boron at a dosage of $5 \times 10^{12}$ atoms/cm². This polycrystalline silicon thin film is approximately 0.1 μm in thickness. The cap film is formed with a CVD oxide film formed at 850° C. As shown in FIG. 16, irregularities on the surface is flattened to as small as 3 nm.

Figure 17:
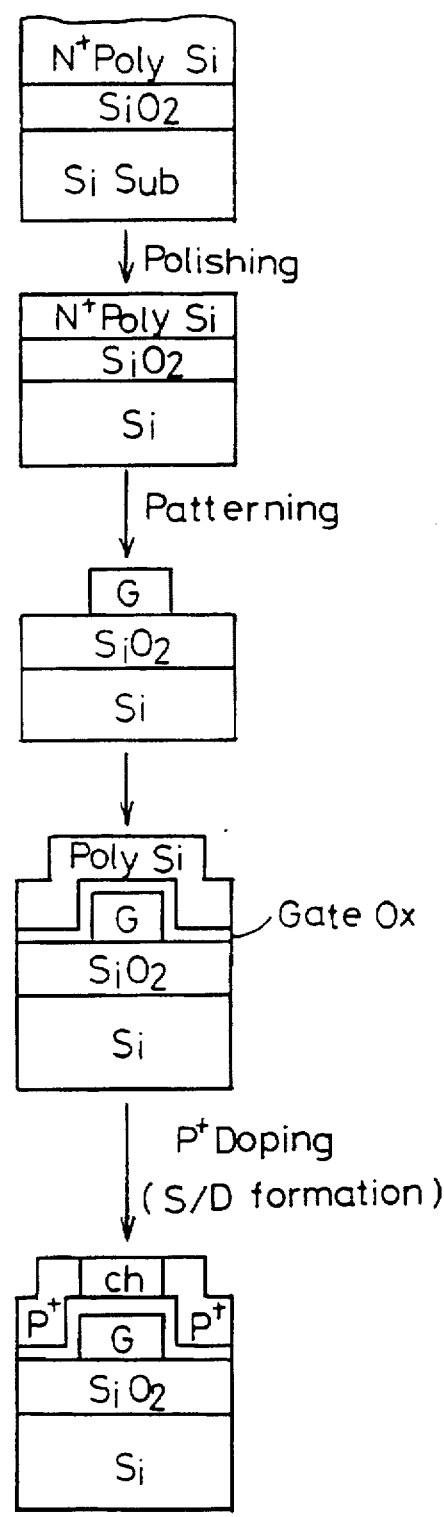
FIG. 17 is a process flow diagram showing a fourth embodiment of a fabricating method according to the present invention.
Figure 18:
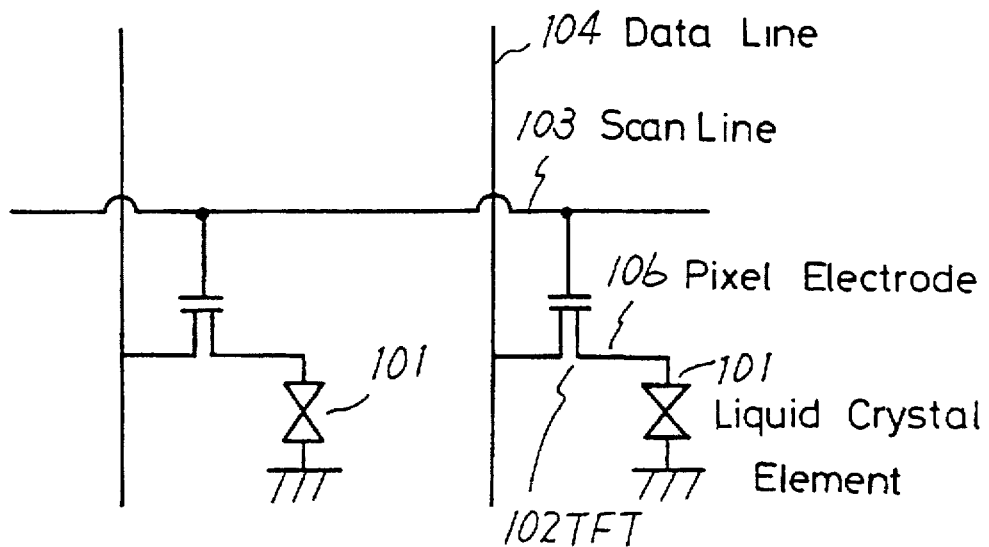
FIG. 18 is a general equivalent circuit diagram of an active matrix type liquid crystal display panel.
Figure 19:
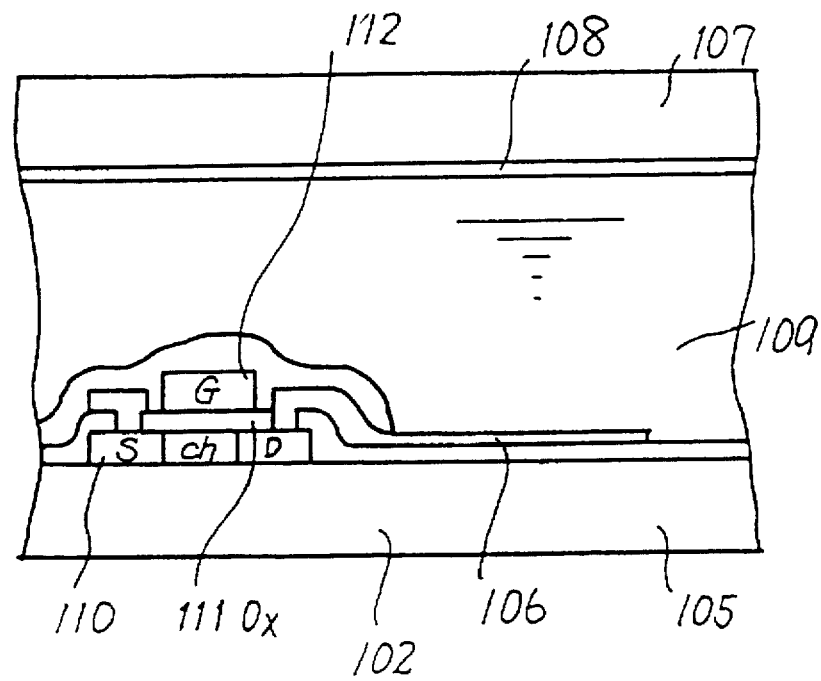
FIG. 19 is a simplified partially sectional view showing a general structure of an active matrix type liquid crystal display panel.
Figure 20:
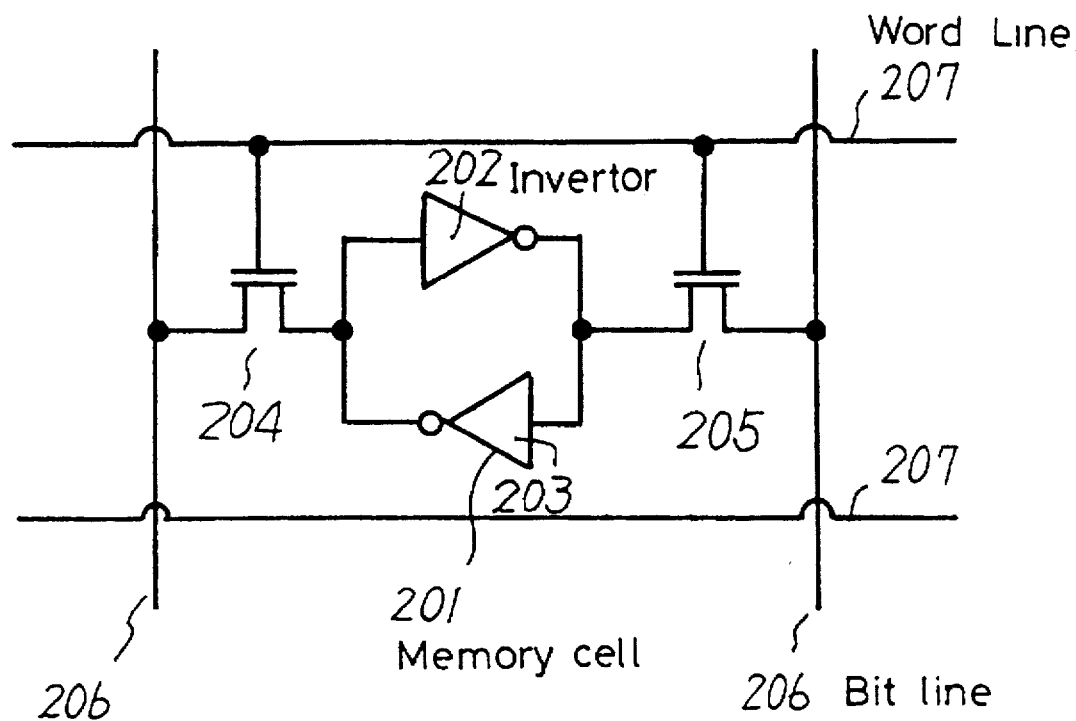
FIG. 20 is a general circuit diagram of the SRAM.
Figure 21:
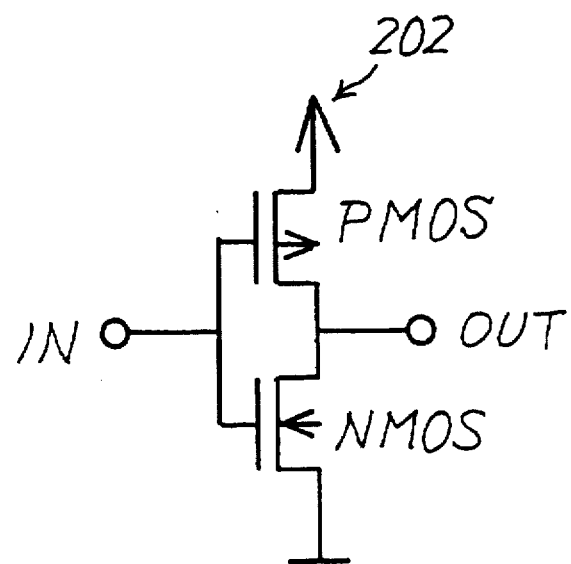
FIG. 21 is a circuit diagram showing an inverter used in the SRAM of FIG. 20.
Figure 22:
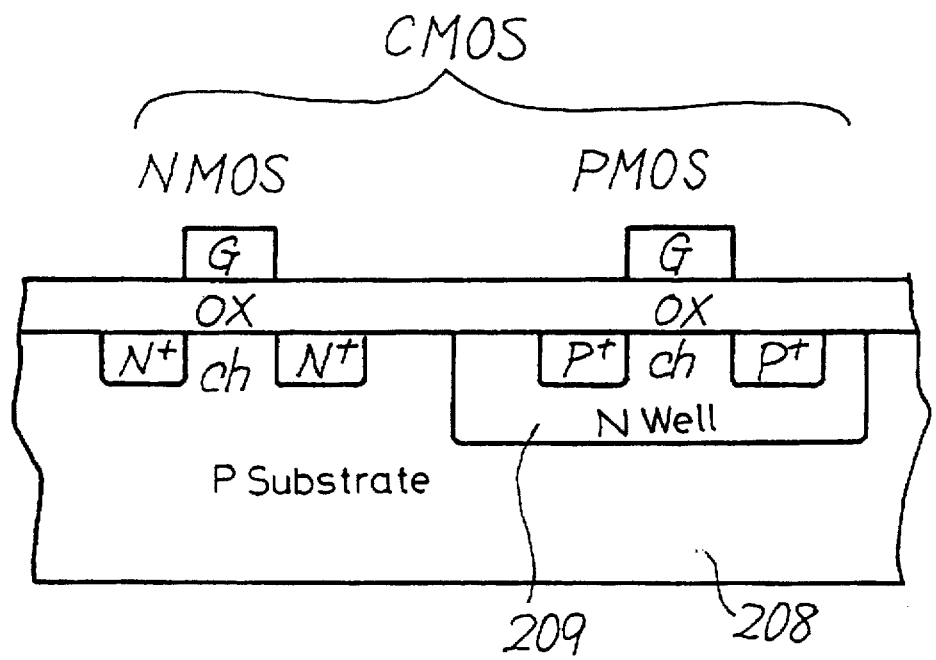
FIG. 22 is a simplified sectional view showing the general structure of a CMOS.
Figure 23:
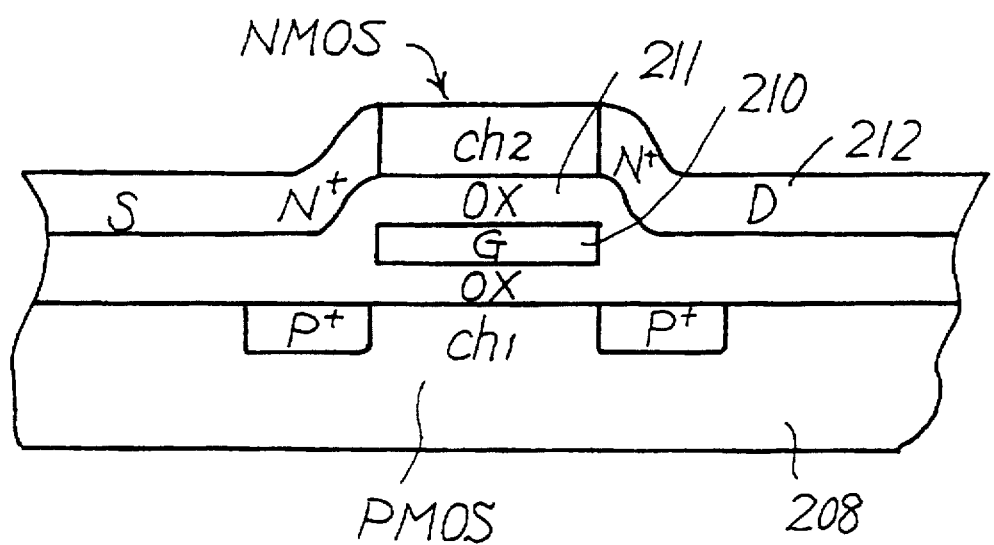
FIG. 23 is a simplified sectional view showing the structure of a CMOS including a TFT structure.

FIG. 17 shows the fourth embodiment of a process of manufacturing a thin film transistor according to the invention. This embodiment is composed of a reverse three-layer structure, which is different from the original three-layer structure mentioned above. In other words, a channel region ch is formed on a gate electrode G.

First of all, a polycrystalline silicon film of n+ type is formed on a silicon dioxide film which has been formed on a surface of a silicon substrate. When the impurity concentration in the poly-Si film is $10^{20}$ atoms/cm$^3$ or more irregularities as deep as 20 nm remain on the surface of the polycrystalline silicon film. Therefore, it is preferable to control the impurity concentration resulting from ion implantation to be less than $10^{19}$ atoms/cm$^3$.

Next, irregularities on the surface of the gate electrode G are reduced by flattening the surface. Generation of irregularities can be prevented if the silicon film is annealed after a cap layer is formed. For instance, polishing can be used as a method for flattening the surface after the generation of irregularities.

Then, the surface roughness becomes less than a few nm. Means other than mechanical polishing can be used for this polishing step, such as the above-mentioned ion implantation, or capping.

Next, the n+ polycrystalline silicon film is patterned to form a gate electrode G. The upper surface of the gate electrode G maintains flatness.

In the next step, a gate insulating film OX is formed. At this time, CVD is preferably adopted rather than thermal oxidation in order to obtain a gate insulating film OX having excellent flatness. By using CVD, the flatness of the gate electrode G is transferred to the surface of the gate insulating film OX.

Then, a second polycrystalline silicon film is deposited on the gate insulating film OX by CVD and so on.

Finally, the second poly-Si film is doped with a p-impurity and with suitable masking, to form a source region S and a drain region D, and a MIS transistor is completed. At this time, flatness is maintained at the interface between the channel region ch and the gate insulating film OX, on the condition that the process temperature after flattening process is kept at a low enough temperature to not recrystallize the poly-Si film and electrical characteristics of the MIS transistor can be improved. At the same time, carrier mobility in the channel region can be improved.

As explained above, the present invention provides an effect that threshold voltage characteristics, ON/OFF current ratio characteristics and so on of the MIS transistor device can be remarkably improved by at least flattening the interface between the channel region and the gate insulating film. The invention has a remarkable effect especially on improvement in the characteristics of the TFT using the polycrystalline silicon thin film as the material of the channel region. Therefore, it largely contributes to high integration and increased component density of an active matrix type liquid crystal display panel using a TFT as a driving device and a SRAM including a TFT as a constituent of a memory cell. Further the present invention has a remarkable effect especially on improvement in the electrical characteristics of the TFT having two channel interfaces and having a thin channel film less than approximately 0.1 µm in thickness.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A thin field effect transistor having a three-layer structure, comprising:

a polycrystalline semiconductor layer having a thickness of less than 0.3 µm and defining a channel region;

an insulating layer defining a gate insulating film contacting the polycrystalline semiconductor layer, so that the gate insulating film and the polycrystalline semiconductor layer contact one another at an interface; and a conductive layer defining a gate electrode on the insulating layer so that the insulating layer is located between the channel and the gate electrode; wherein the interface is substantially flat and has a surface roughness of less than 3 nm between the channel region and the gate insulating film, and the channel region has a number of grains more than 10.

2. A thin film field effect transistor as claimed in claim 1 wherein the flat interface has a surface roughness of less than 1/50 the thickness of the polycrystalline semiconductor layer.

3. A thin film field effect transistor device comprising a silicon substrate, a silicon oxide layer on said silicon substrate and a three-layer thin film field effect transistor structure on said silicon oxide layer, said three-layer structure comprising:

a polycrystalline semiconductor layer defining a channel region;

an insulating layer defining a gate insulating film contacting the polycrystalline semiconductor layer, so that the gate insulating film and the polycrystalline semiconductor layer contact one another at an interface; and a conductive layer defining a gate electrode on the insulating layer so that the insulating layer is located between the channel region and the gate electrode;

wherein the interface is substantially flat at least between the channel region and the gate insulating film, wherein the silicon oxide layer and the polycrystalline semiconductor layer contact one another at a second interface which is substantially flat, and wherein the silicon oxide layer has, at the second interface, a surface roughness under a few nm.

4. A thin film field effect transistor device comprising a silicon substrate, a silicon oxide layer on said silicon substrate and a three-layer thin film field effect transistor structure on said silicon oxide layer, said three-layer structure comprising:

a polycrystalline semiconductor layer defining a channel region;

an insulating layer defining a gate insulating film contacting the polycrystalline semiconductor layer, so that the gate insulating film and the polycrystalline semiconductor layer contact one another at an interface; and a conductive layer defining a gate electrode on the insulating layer so that the insulating layer is located between the channel region and the gate electrode;

wherein the interface is substantially flat at least between the channel region and the gate insulating film, wherein the silicon oxide layer and the polycrystalline semiconductor layer contact one another at a second interface which is substantially flat, wherein the silicon substrate and the silicon oxide layer contact one another at a third interface which is substantially flat, and wherein the silicon substrate has, at third interface, a surface roughness under a few nm.

5. A thin film field effect transistor device comprising a silicon substrate, a silicon oxide layer on said silicon substrate and a three-layer thin film field effect transistor structure on said silicon oxide layer, said three-layer structure comprising:

a polycrystalline semiconductor layer defining a channel region;

an insulating layer defining a gate insulating film contacting the polycrystalline semiconductor layer, so that the gate insulating film and the polycrystalline semiconductor layer contact one another at an interface; and a conductive layer defining a gate electrode on the insulating layer so that the insulating layer is located between the channel region and the gate electrode;

wherein the interface is substantially flat at least between the channel region and the gate insulating film, and wherein the gate electrode contacts the silicon oxide layer and the gate insulating film contact the gate electrode to form a second interface which is substantially flat.

6. A thin film field effect transistor device as claimed in claim 5 wherein the gate electrode has, at the second interface, a surface roughness under 2 nm.

* * * * *